(12) United States Patent
Park et al.

(10) Patent No.: US 11,437,380 B2
(45) Date of Patent: Sep. 6, 2022

(54) SEMICONDUCTOR MEMORY DEVICE AND METHOD OF MANUFACTURING THE SAME

(71) Applicant: SAMSUNG ELECTRONICS CO., LTD., Suwon-si (KR)

(72) Inventors: Kwang-Ho Park, Cheonan-si (KR); Jae Hoon Kim, Seoul (KR); Yong-Hoon Son, Yongin-si (KR); Seung Jae Jung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/898,640

(22) Filed: Jun. 11, 2020

(65) Prior Publication Data

US 2021/0134800 A1 May 6, 2021

(30) Foreign Application Priority Data

Oct. 30, 2019 (KR) ........................ 10-2019-0136289

(51) Int. Cl.
*H01L 27/06* (2006.01)
*H01L 27/108* (2006.01)
*H01L 21/768* (2006.01)

(52) U.S. Cl.
CPC ...... *H01L 27/108* (2013.01); *H01L 21/76802* (2013.01); *H01L 21/76877* (2013.01); *H01L 27/0688* (2013.01); *H01L 27/10805* (2013.01)

(58) Field of Classification Search
None
See application file for complete search history.

(56) References Cited

U.S. PATENT DOCUMENTS

| | | | |
|---|---|---|---|
| 8,338,882 B2 | 12/2012 | Tanaka et al. | |
| 9,165,823 B2 | 10/2015 | Chen | |
| 9,871,053 B2 | 1/2018 | Kwak | |
| 10,297,543 B2 | 5/2019 | Park et al. | |
| 10,312,138 B2 | 6/2019 | Hyun et al. | |
| 10,680,003 B2* | 6/2020 | Lu | H01L 21/31144 |
| 2017/0084532 A1* | 3/2017 | Son | H01L 23/5226 |
| 2017/0271354 A1* | 9/2017 | Kwak | H01L 27/11548 |
| 2018/0053686 A1* | 2/2018 | Hyun | H01L 27/11582 |
| 2018/0166380 A1* | 6/2018 | Park | H01L 27/11575 |
| 2018/0301460 A1 | 10/2018 | Yoo et al. | |
| 2019/0043880 A1 | 2/2019 | Lee et al. | |
| 2019/0103407 A1* | 4/2019 | Kim | H01L 28/86 |
| 2019/0164985 A1 | 5/2019 | Lee et al. | |

* cited by examiner

*Primary Examiner* — Bradley Smith
*Assistant Examiner* — William Henry Anderson
(74) *Attorney, Agent, or Firm* — Lee IP Law, P.C.

(57) ABSTRACT

A semiconductor memory device including first-first conductive lines on a substrate; second-first conductive lines on the first-first conductive lines; first contacts connected to the first-first conductive lines; and second contacts connected to the second-first conductive lines, wherein the first-first conductive lines protrude in a first direction beyond the second-first conductive lines; the first-first conductive lines include first regions having a first thickness, second regions having a second thickness, the second thickness being greater than the first thickness, and third regions having a third thickness, the third thickness being smaller than the first thickness and smaller than the second thickness, and the second regions of the first-first conductive lines are between the first regions of the first-first conductive lines and the third regions of the first-first conductive lines.

15 Claims, 25 Drawing Sheets

Fig. 3A
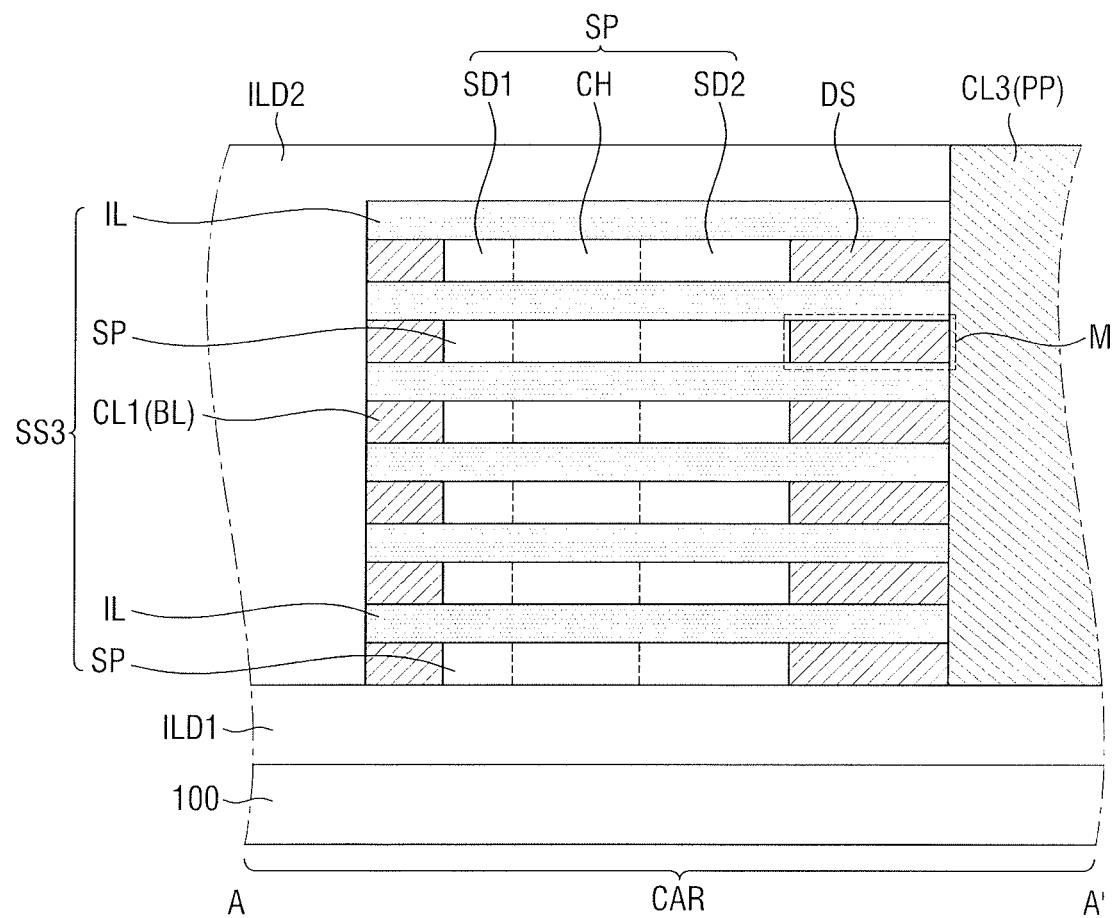
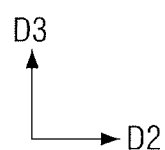

Fig. 5B
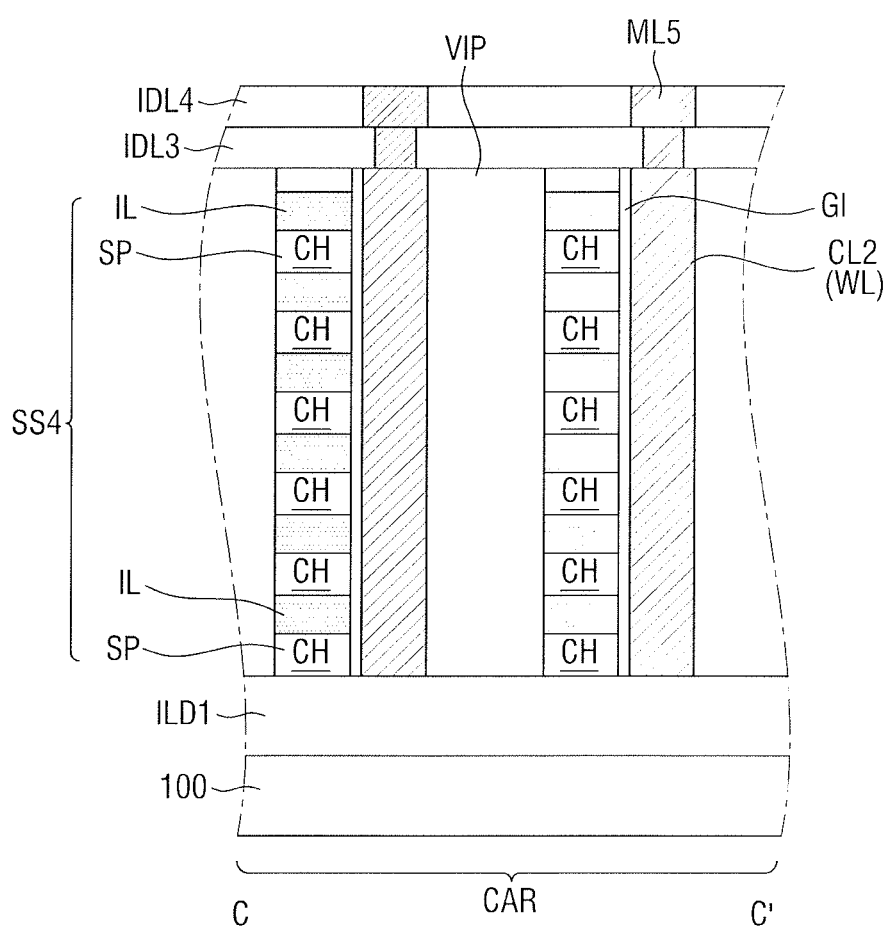
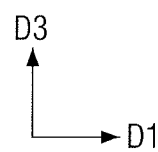

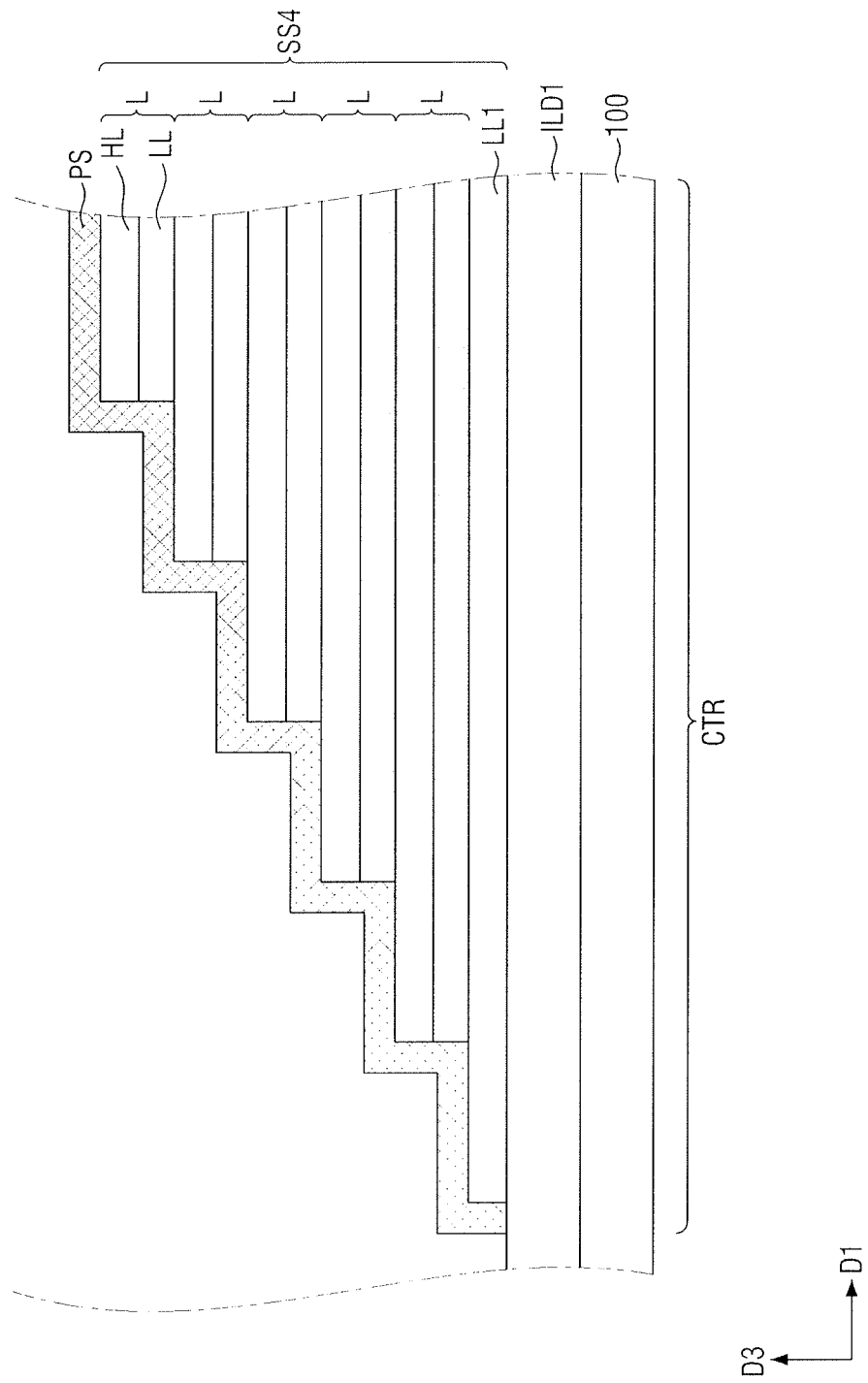

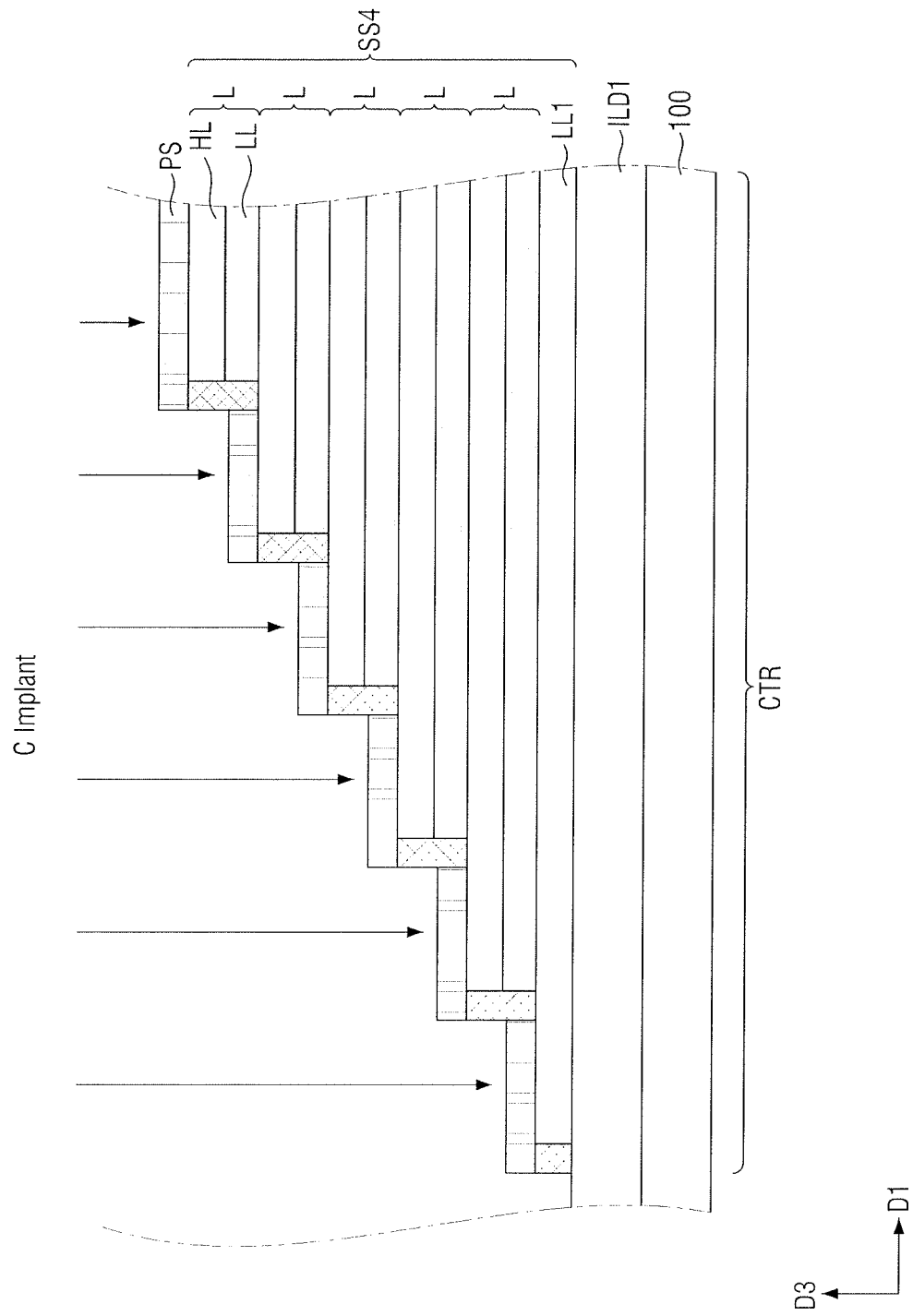

SEMICONDUCTOR MEMORY DEVICE AND METHOD OF MANUFACTURING THE SAME

CROSS-REFERENCE TO RELATED APPLICATION

Korean Patent Application No. 10-2019-0136289, filed on Oct. 30, 2019, in the Korean Intellectual Property Office, and entitled: "Semiconductor Memory Device And Method of Manufacturing the Same," is incorporated by reference herein in its entirety.

BACKGROUND

1. Field

Embodiments relate to a semiconductor memory device and a method of manufacturing the same.

2. Description of the Related Art

In order to improve the integration density of dynamic random access memories (DRAMs), a structure has been suggested in which unit elements, each consisting of transistors and capacitors, are formed along a horizontal direction and are vertically stacked.

SUMMARY

The embodiments may be realized by providing a semiconductor memory device including first-first conductive lines on a substrate; second-first conductive lines on the first-first conductive lines; first contacts connected to the first-first conductive lines; and second contacts connected to the second-first conductive lines, wherein the first-first conductive lines protrude in a first direction beyond the second-first conductive lines; the first-first conductive lines include first regions having a first thickness, second regions having a second thickness, the second thickness being greater than the first thickness, and third regions having a third thickness, the third thickness being smaller than the first thickness and smaller than the second thickness, and the second regions of the first-first conductive lines are between the first regions of the first-first conductive lines and the third regions of the first-first conductive lines.

The embodiments may be realized by providing a semiconductor memory device including first semiconductor patterns and second semiconductor patterns extending in a second direction over a substrate, the first semiconductor patterns being spaced apart from the second semiconductor patterns in a third direction, which is different from the second direction; first-first conductive lines connected to the first semiconductor patterns and extending in a first direction, which is different from the second direction and the third direction; second-first conductive lines connected to the second semiconductor patterns and extending in the first direction; gate electrodes extending in the third direction, the gate electrodes being adjacent to the first semiconductor patterns and the second semiconductor patterns; and contacts connected to the first-first conductive lines, wherein the second-first conductive lines extend along the first-first conductive lines over the first-first conductive lines, the first-first conductive lines protrude in the first direction beyond the second-first conductive lines, the first-first conductive lines include first regions having a first thickness in the third direction and second regions having a second thickness in the third direction, the second thickness being greater than the first thickness, and the contacts are connected to the second regions of the first-first conductive lines.

The embodiments may be realized by providing a semiconductor memory device including a plurality of semiconductor patterns stacked in a third direction on a substrate and extending in a second direction that is different from the third direction; a plurality of first conductive lines connected to the plurality of semiconductor patterns, respectively, and extending in a first direction that is different from the second direction and the third direction; and a plurality of first gate electrodes adjacent to the plurality of semiconductor patterns, respectively, and extending in the third direction, wherein the plurality of conductive lines include first-first conductive lines and second-first conductive lines, the second-first conductive lines being adjacent in the third direction to the first-first conductive lines, the first-first conductive lines include protruding parts that protrude in the first direction beyond the second-first conductive lines, and a thickness in the third direction of parts of the first-first conductive lines that overlap in the third direction with the second-first conductive lines is smaller than a thickness in the third direction of the protruding parts of the first-first conductive lines.

BRIEF DESCRIPTION OF THE DRAWINGS

Features will be apparent to those of skill in the art by describing in detail exemplary embodiments with reference to the attached drawings in which:

FIGS. 3A, 3B, and 3C illustrate cross-sectional views taken along lines A-A', B-B', and C-C' of FIG. 2;

FIG. 5B illustrates a cross-sectional view taken along line C-C' of FIG. 4;

FIGS. 7 and 8 illustrate cross-sectional views of stages in a method of fabricating a contact region of a semiconductor memory device according to some embodiments of the present disclosure;

FIGS. 9A and 9B illustrate cross-sectional views of stages in a method of fabricating a contact region of a semiconductor memory device according to some embodiments of the present disclosure;

DETAILED DESCRIPTION

Figure 1:
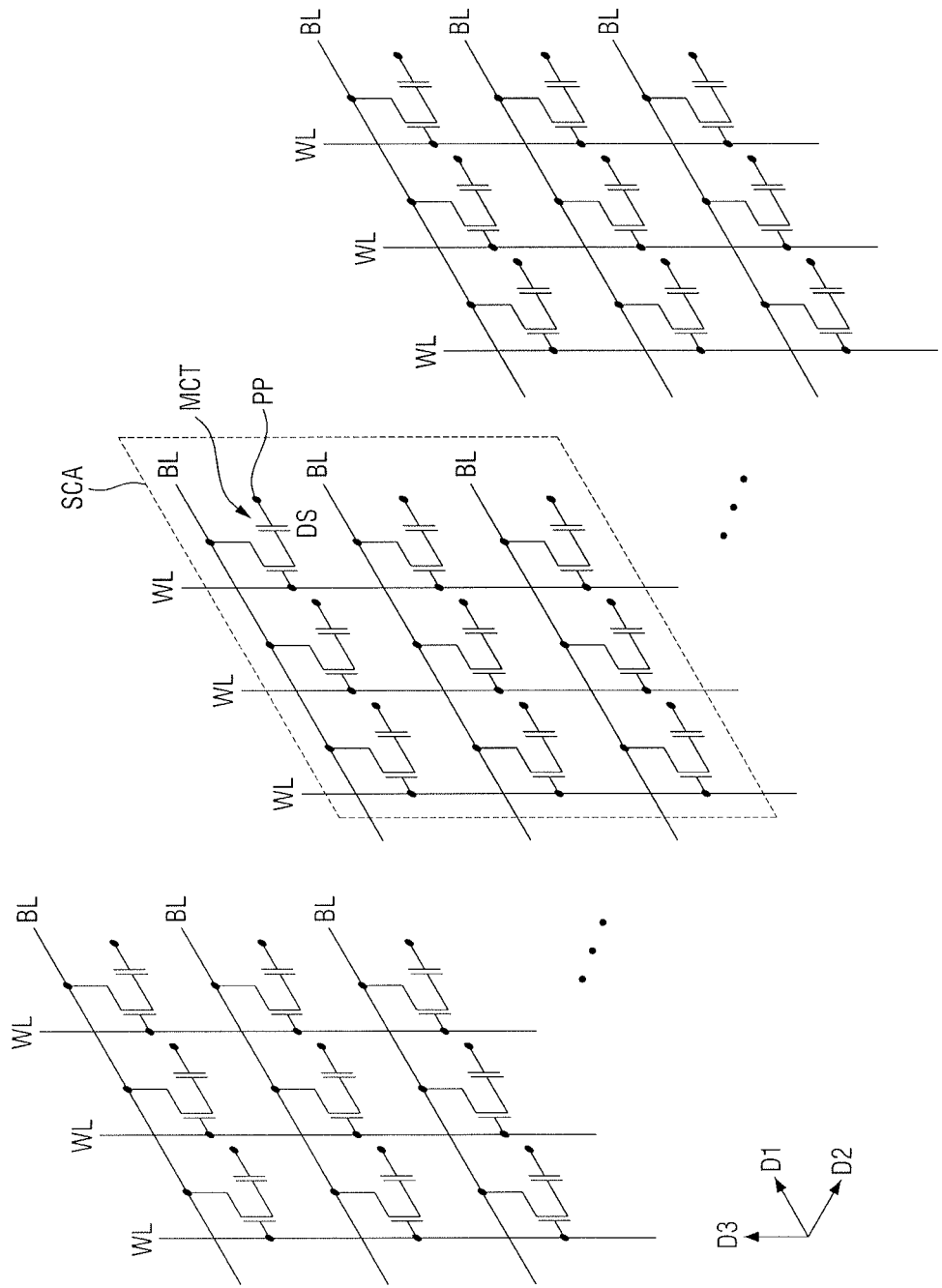
FIG. 1 illustrates a circuit diagram of a cell array of a semiconductor memory device according to some embodiments of the present disclosure.

FIG. 1 is a circuit diagram of a cell array of a semiconductor memory device according to some embodiments of the present disclosure. Referring to FIG. 1, the cell array of a three-dimensional (3D) semiconductor memory device may include a plurality of sub-cell arrays SCA. The sub-cell arrays SCA may be arranged along a second direction D2.

Each of the sub-cell arrays SCA may include a plurality of bitlines BL, a plurality of wordlines WL, and a plurality of memory cell transistors MCT. A memory cell transistor MCT may be between a wordline WL and a bitline BL.

The bitlines BL may be conductive patterns (e.g., metal lines) that are on a substrate and spaced apart from the substrate. The bitlines BL may extend in a first direction D1 (e.g., crossing the second direction D2). The bitlines BL may be spaced apart from one another in a vertical direction (e.g., a third direction D3 crossing the first direction D1 and the second direction D2).

The wordlines WL may be conductive patterns (e.g., metal lines) which extend in the vertical direction (the third direction D3) from the substrate. The wordlines WL may be spaced apart from one another in the first direction D1.

The gates of the memory cell transistors MCT may be connected to the wordlines WL, and the sources of the memory cell transistors MCT may be connected to the bitlines BL. The memory cell transistors MCT may include information storage elements DS. In an implementation, the information storage elements DS may be capacitors, and the drains of the memory cell transistors MCT may be connected to the first electrodes of the capacitors, and the second electrodes of the capacitors may be connected to ground wires PP.

Figure 2:
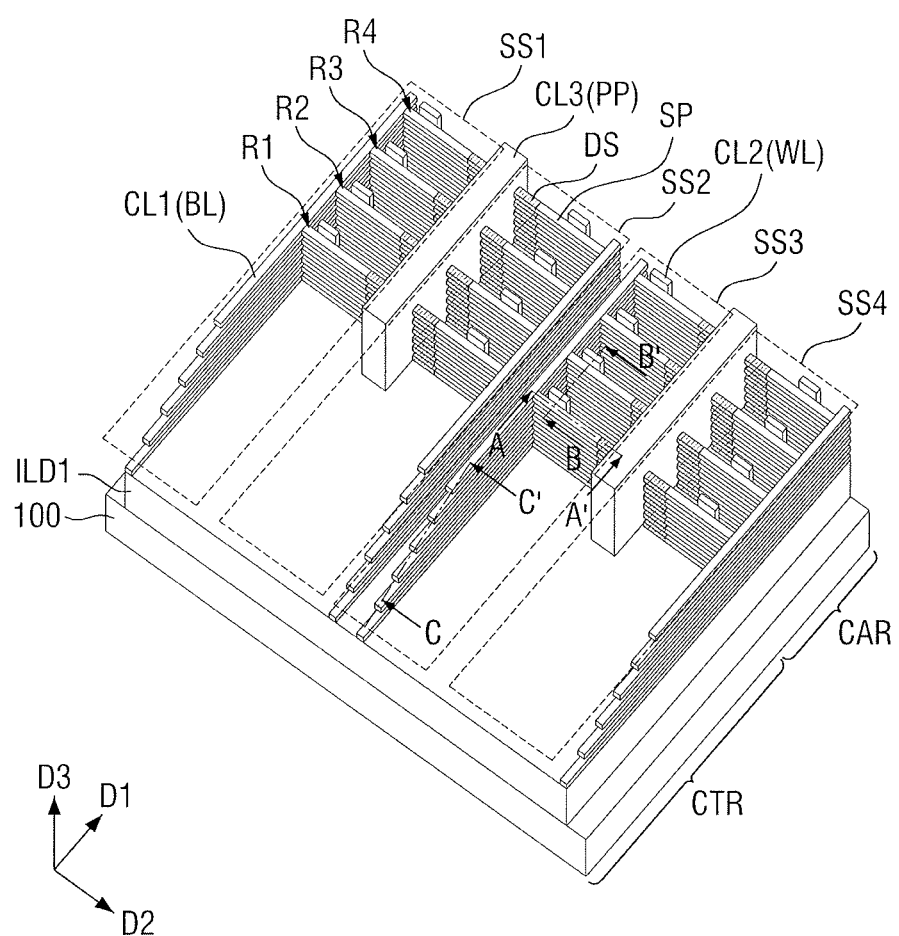
FIG. 2 illustrates a perspective view of a semiconductor memory device according to some embodiments of the present disclosure.
Figure 3B:
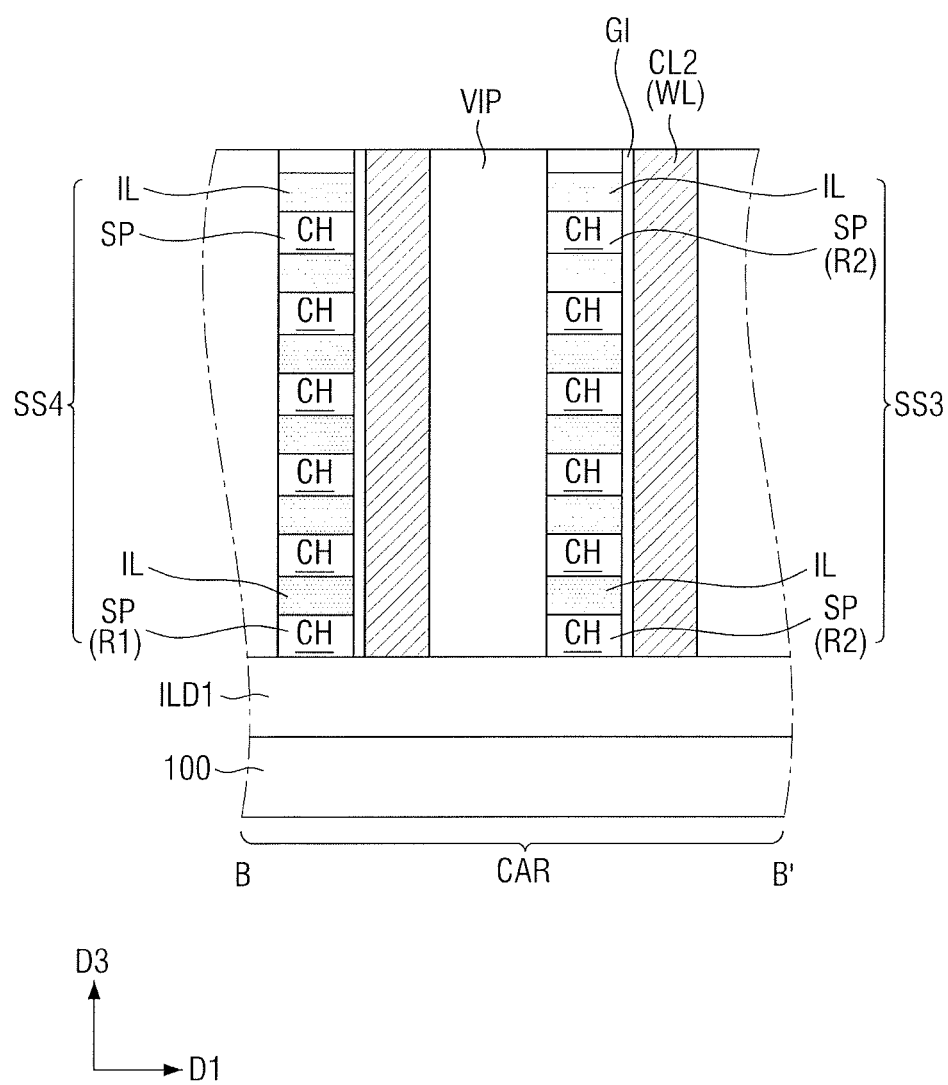
Figure 3C:
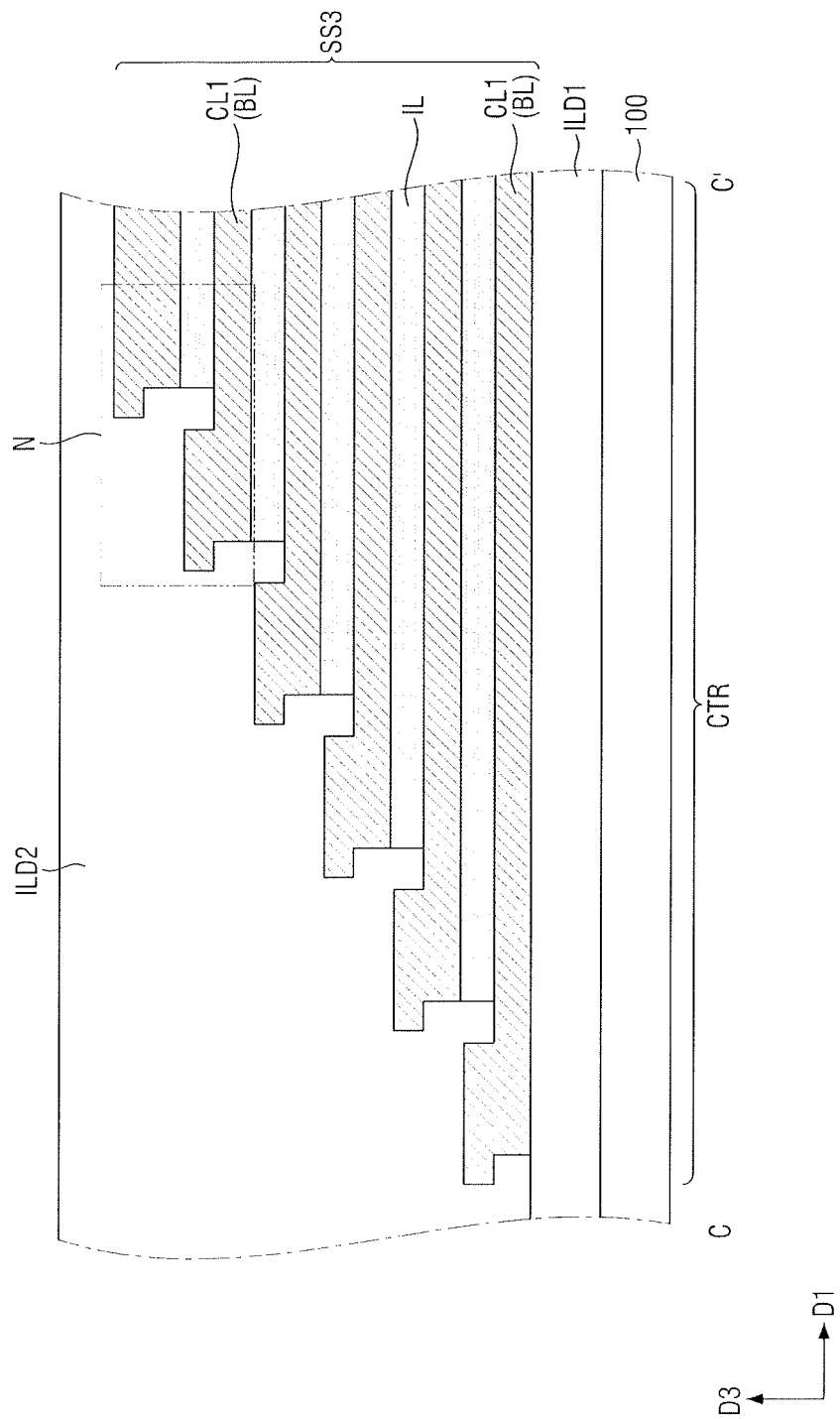
Figure 3D:
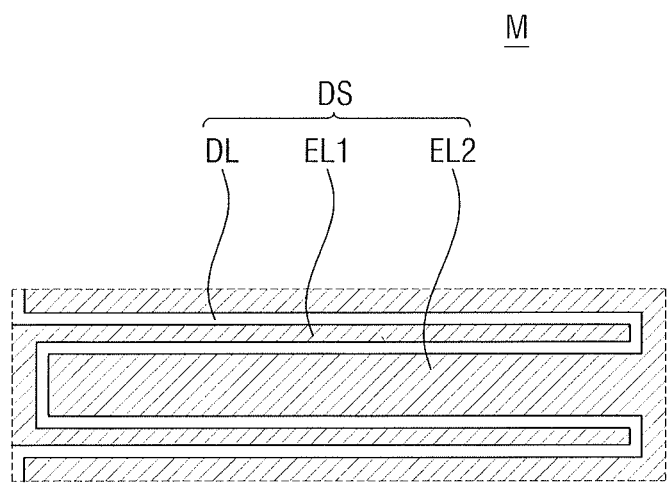
FIG. 3D illustrates an enlarged cross-sectional view of an area M of FIG. 3A.
Figure 3E:
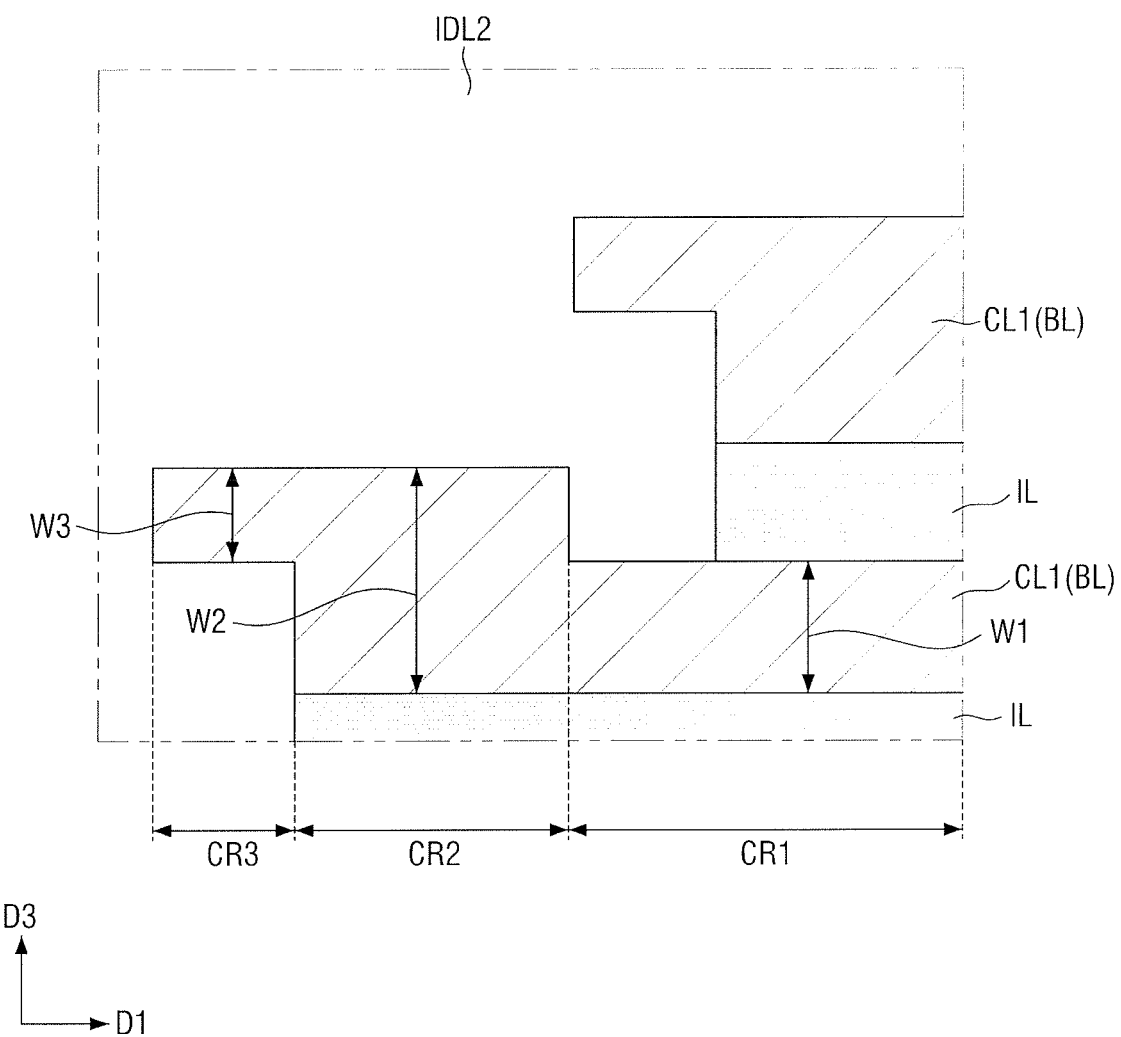
FIG. 3E illustrates an enlarged cross-sectional view of an area N of FIG. 3B.

FIG. 2 is a perspective view of a semiconductor memory device according to some embodiments of the present disclosure. FIGS. 3A, 3B, and 3C are cross-sectional views taken along lines A-A', B-B', and C-C' of FIG. 2. FIG. 3D is an enlarged cross-sectional view of an area M of FIG. 3A. FIG. 3E is an enlarged cross-sectional view of an area N of FIG. 3B.

Referring to FIGS. 1, 2, and 3A through 3D, a substrate 100 including a cell region CAR and a contact region CTR may be provided. A first interlayer insulating film ILD1 may be on the substrate 100. The substrate 100 may be a silicon substrate, a germanium substrate, or a silicon-germanium substrate. As used herein, the term "or" is not an exclusive term, e.g., "A or B" would include A, B, or A and B.

First through fourth stack structures SS1 through SS4 may be on the substrate 100. The first through fourth stack structures SS1 through SS4 may be vertically spaced apart from the substrate 100 by the first interlayer insulating film ILD1. The first through fourth stack structures SS1 through SS4 may extend in the first direction D1 in parallel to one another. The first through fourth stack structures SS1 through SS4 may be arranged along the second direction D2. Each of the first through fourth stack structures SS1 through SS4 may include a plurality of sub-cell arrays SCA, as illustrated in FIG. 1.

Each of the first through fourth stack structures SS1 through SS4 may include semiconductor patterns SP and interlayer insulating films IL, which are alternately stacked on the first interlayer insulating film ILD1 (e.g., in the third direction D3). The semiconductor patterns SP, which are vertically stacked, may be vertically spaced apart from one another by the interlayer insulating films IL. The interlayer insulating films IL may be between the semiconductor patterns SP, which are vertically adjacent to one another. Each of the interlayer insulating films IL may include, e.g., a silicon oxide film, a silicon nitride film, a silicon oxynitride film, a carbon-based silicon oxide film, a carbon-based silicon nitride film, or a carbon-based silicon oxynitride film.

The semiconductor patterns SP may be formed as lines, bars, or pillars that extend in the second direction D2. In an implementation, the semiconductor patterns SP may include silicon, germanium, silicon-germanium, or indium gallium zinc oxide (IGZO). Each of the semiconductor patterns SP may include a first impurity region SD1, a second impurity region SD2, and a channel region CH.

The channel region CH may be between the first and second impurity regions SD1 and SD2. The first and second impurity regions SD1 and SD2 may have a first conductivity type (e.g., an n type). The channel region CH may be undoped or may have a second conductivity type (e.g., a p type), which is different from the first conductivity type. The channel region CH may correspond to the channel of each memory cell transistor MCT of FIG. 1. The first and second impurity regions SD1 and SD2 may correspond to the source and drain of each memory cell transistor MCT of FIG. 1.

The semiconductor patterns SP may be on the cell region CAR of the substrate 100. Each of the first through fourth stack structures SS1 through SS4 may include first through fourth semiconductor pattern rows R1 through R4. Each of the first through fourth semiconductor pattern rows R1 through R4 may include semiconductor patterns SP that are vertically stacked to overlap with one another. In an implementation, each of the first through fourth semiconductor pattern rows R1 through R4 may include, e.g., six semiconductor patterns SP. The first through fourth semiconductor pattern rows R1 through R4 may be arranged along the first direction D1, e.g., to be spaced apart from one another in the first direction D1.

Each of the first through fourth stack structures SS1 through SS4 may further include first conductive lines CL1 that are vertically stacked. The first conductive lines CL1 may be vertically spaced apart from one another by the interlayer insulating films IL. One interlayer insulating film IL may be between each pair of vertically adjacent first conductive lines CL1.

The first conductive lines CL1 may have a shape of lines or bars that extend in the first direction D1. The first conductive lines CL1 may extend from the cell region CAR to the contact region CTR of the substrate 100.

Each of the first conductive lines CL1 may be in direct contact with semiconductor patterns SP. In an implementation, each of the first conductive lines CL1 may be on substantially the same level as corresponding ones of the semiconductor patterns SP (e.g., the first conductive lines CL1 may be a same distance from the substrate 100 in the third direction D3 as laterally adjacent ones of the semiconductor patterns SP). Each of the first conductive lines CL1 may be connected to the first impurity regions SD1 of corresponding ones of the semiconductor patterns SP. Semiconductor patterns SP from the first through fourth semiconductor pattern rows R1 through R4 that are on the same level as each of the first conductive lines CL1 may extend in the second direction D2.

Referring to FIGS. 3A through 3E, second conductive lines CL2 may be on the cell region CAR of the substrate 100 to penetrate each of the first through fourth stack structures SS1 through SS4. The second conductive lines CL2 may be formed as pillars or bars that extend in a direction perpendicular to the top surface of the substrate 100 (e.g., in the third direction D3). The second conductive lines CL2 may be arranged or spaced apart in the first direction D1. The second conductive lines CL2 may be adjacent to the first through fourth semiconductor pattern rows R1 through R4 of each of the first through fourth stack structures SS1 through SS4.

In an implementation, a first-second conductive line CL2 that penetrates the third stack structure SS3 may be adjacent to sidewalls of semiconductor patterns SP of the first semiconductor pattern row R1 of the third stack structure SS3, a second-second conductive line CL2 that penetrates the third stack structure SS3 may be adjacent to sidewalls of semiconductor patterns SP of the second semiconductor pattern row R2 of the third stack structure SS3, and a vertical insulating pattern VIP may be between the first-second conductive line CL2 and the second semiconductor pattern row R2 of the third stack structure SS3. The vertical insulating pattern VIP may include a silicon oxide film.

Each of the second conductive lines CL2 may be on channel regions CH of a neighboring row of semiconductor patterns SP. The second conductive lines CL2 may be gate electrodes. In an implementation, the second conductive lines CL2 may be the gates of the memory cell transistors MCT of FIG. 1. Gate insulating films G1 may be between the second conductive lines CL2 and the channel regions CH of rows of semiconductor patterns SP. Each of the gate insulating films G1 may include a high-k film, a silicon oxide film, a silicon nitride film, a silicon oxynitride film, or a combination thereof. In an implementation, the high-k film may include, e.g., hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

The second conductive lines CL2 may include a conductive material. In an implementation, the conductive material may include, e.g., a doped semiconductor material, a conductive metal nitride, a metal, or a metal-semiconductor compound. The second conductive lines CL2 may be the wordlines WL of FIG. 1.

Referring to FIG. 3C, each of the first through fourth stack structures SS1 through SS4, e.g., the third stack structure SS3, may have a stepped structure on the contact region CTR of the substrate 100. The length, in the first direction D1, of the first conductive lines CL1 of the third stack structure SS3, which are stacked on the contact region CTR, may decrease in a direction moving away from the top surface of the substrate 100. For example, among the first conductive lines CL1 of the third stack structure SS3, the lowermost first conductive line CL1 (e.g., the first conductive line CL1 proximate to the substrate 100 in the third direction D3) may be longer than other first conductive lines CL1 (e.g., first conductive lines CL1 distal to the substrate 100 in the third direction D3). An uppermost first conductive line CL1 may be shorter than (e.g., may have a smallest length in the first direction D1) of the other first conductive lines CL1.

The first conductive lines CL1 may include a conductive material. In an implementation, the conductive material may include a doped semiconductor material (e.g., doped silicon or doped germanium), a conductive metal nitride (e.g., titanium nitride or tantalum nitride), a metal (e.g., tungsten, titanium, or tantalum), or a metal-semiconductor compound (e.g., tungsten silicide, cobalt silicide, or titanium silicide). The first conductive lines CL1 may be the bitlines BL of FIG. 1.

Each of the first through fourth stack structures SS1 through SS4 may further include information storage elements DS that are vertically stacked. The information storage elements DS may be vertically spaced apart from one another by the interlayer insulating films IL. The information storage elements DS may extend in the second direction D2 from semiconductor patterns SP.

The information storage elements DS may be in direct contact with the semiconductor patterns SP. For example, the information storage elements DS may be on substantially the same level as the semiconductor patterns SP. The information storage elements DS may be connected to second impurity regions SD2 of the semiconductor patterns SP.

Referring to FIG. 3D, an information storage element DS may include a first electrode EL1, an insulating film DL, and a second electrode EL2. In an implementation, the information storage element DS may be a capacitor.

The first electrode EL1 may be connected directly to one second impurity region SD2 of a semiconductor pattern SP. The first electrode EL1 may be in the shape of a hollow cylinder. The first electrode EL1 may include, e.g., a metal, a metal nitride film, or a metal silicide. In an implementation, the first electrode EL1 may include a film of a metal with a high melting point, e.g., cobalt, titanium, nickel, tungsten, or molybdenum. In an implementation, the first electrode EL1 may include a metal nitride film, e.g., a titanium nitride film, a titanium silicon film, a titanium aluminum nitride film, a tantalum nitride film, a tantalum silicon nitride film, a tantalum aluminum nitride film, or a tungsten nitride film.

The insulating film DL may be between the first and second electrodes EL1 and EL2. The insulating film DL may directly cover inner sidewalls of the first electrode EL1. In an implementation, the insulating film DL may include a metal oxide, e.g., hafnium oxide, zirconium oxide, aluminum oxide, lanthanum oxide, tantalum oxide, or titanium oxide or a dielectric material with a perovskite structure, e.g., $SrTiO_3$ (STO), $(Ba,Sr)TiO_3$ (BST), $BaTiO_3$, PZT, or PLZT.

The second electrode EL2 may be on the insulating film DL. The second electrode EL2 may fill the inside of the first electrode EL1, which has a cylindrical shape. The second electrode EL2 may be connected to third conductive line CL3, which will be described in greater detail below. The second electrode EL2 may include, e.g., silicon doped with impurities, a metal, a metal nitride film, or a metal silicide. In an implementation, the second electrode EL2 may include substantially the same material as the first electrode EL1.

The third conductive lines CL3 may extend in the first direction D1 in parallel to the first through fourth stack structures SS1 through SS4 and may be on the cell region CAR of the substrate 100. A first-third conductive line CL3 may be between the first and second stack structures SS1 and SS2, and a second-third conductive line CL3 may be between the third and fourth stack structures SS3 and SS4.

The first-third conductive line CL3 may be connected in common to second electrodes EL2 of capacitors of each of the first and second stack structures SS1 and SS2, and the second-third conductive line CL3 may be connected in common to second electrodes EL2 of capacitors of each of the third and fourth stack structures SS3 and SS4.

The third conductive lines CL3 may include a conductive material. In an implementation, the conductive material may include, e.g., a doped semiconductor material, a conductive metal nitride, a metal, or a metal-semiconductor compound. The third conductive lines CL3 may be the ground wires PP of FIG. 1.

The first and second stack structures SS1 and SS2 may have substantially the same structure as the third and fourth stack structures SS3 and SS4. The first and second stack structures SS1 and SS2 may be symmetrical with the third and fourth stack structures SS3 and SS4. The first and second stack structures SS1 and SS2 may be mirror-symmetrical with each other with respect to the third conductive lines CL3 (e.g., about a line extending in the first direction D1 through the third conductive lines CL3). The third and fourth stack structures SS3 and SS4 may be mirror-symmetrical with each other with respect to the third conductive lines CL3. The second and third stack structures SS2 and SS3 may be mirror-symmetrical with each other with respect to a second interlayer insulating film ILD2, which is filled between the second and third stack structures SS2 and SS3.

Referring to FIG. 3E, an upper first conductive line CL1 may be on a lower first conductive line CL1 along the third direction D3. An interlayer insulating film IL may be on the bottom surface of the lower first conductive line CL1, and another interlayer insulating film IL may be between the lower first conductive line CL1 and the upper first conductive line CL1. A side of the upper first conductive line CL1 may be aligned with a side of the interlayer insulating film IL that is in contact with the upper first conductive line CL1.

Each of the first conductive lines CL1 may be divided into three parts depending on its thickness (as measured in the third direction D3). Each of the first conductive lines CL1 may include a first region CR1 having a first thickness W1, a second region CR2 having a second thickness W2, and a third region CR3 having a third thickness W3. The second region CR2 may be between the first and third regions CR1 and CR3 and may be directly connected to the first and third regions CR1 and CR3.

The first thickness W1 of the first region CR1 may be smaller than the second width W2 of the second region CR2. The first region CR1 may be in part in contact with an interlayer insulating film IL and in part in contact with the second interlayer insulating film ILD2, which is on the first interlayer insulating film ILD1 to cover the first through fourth stack structures SS1 through SS4. Each of the first and second interlayer insulating films ILD1 and ILD2 may include, e.g., a silicon oxide film, a silicon nitride film, or a silicon oxynitride film.

The second thickness W2 of the second region CR2 may be greater than the first thickness W1 of the first region CR1 and greater than the third thickness W3 of the third region CR3. In an implementation, the bottom (e.g., substrate 100-facing) surfaces of the first and second regions CR1 and CR2 may be on the same plane. In an implementation, sides of the second region CR may be aligned with sides of the interlayer insulating film IL that is in contact with the bottom surface of the second region CR2.

The third thickness W3 of the third region CR3 may be smaller than the first thickness W1 of the first region CR1 and may be smaller than the second thickness W2 of the second region CR2. The bottom (e.g., substrate 100-facing) surface of the third region CR3 may be higher (e.g., farther from the substrate 100) in the third direction D3 than the bottom surface of the second region CR2.

Figure 4:
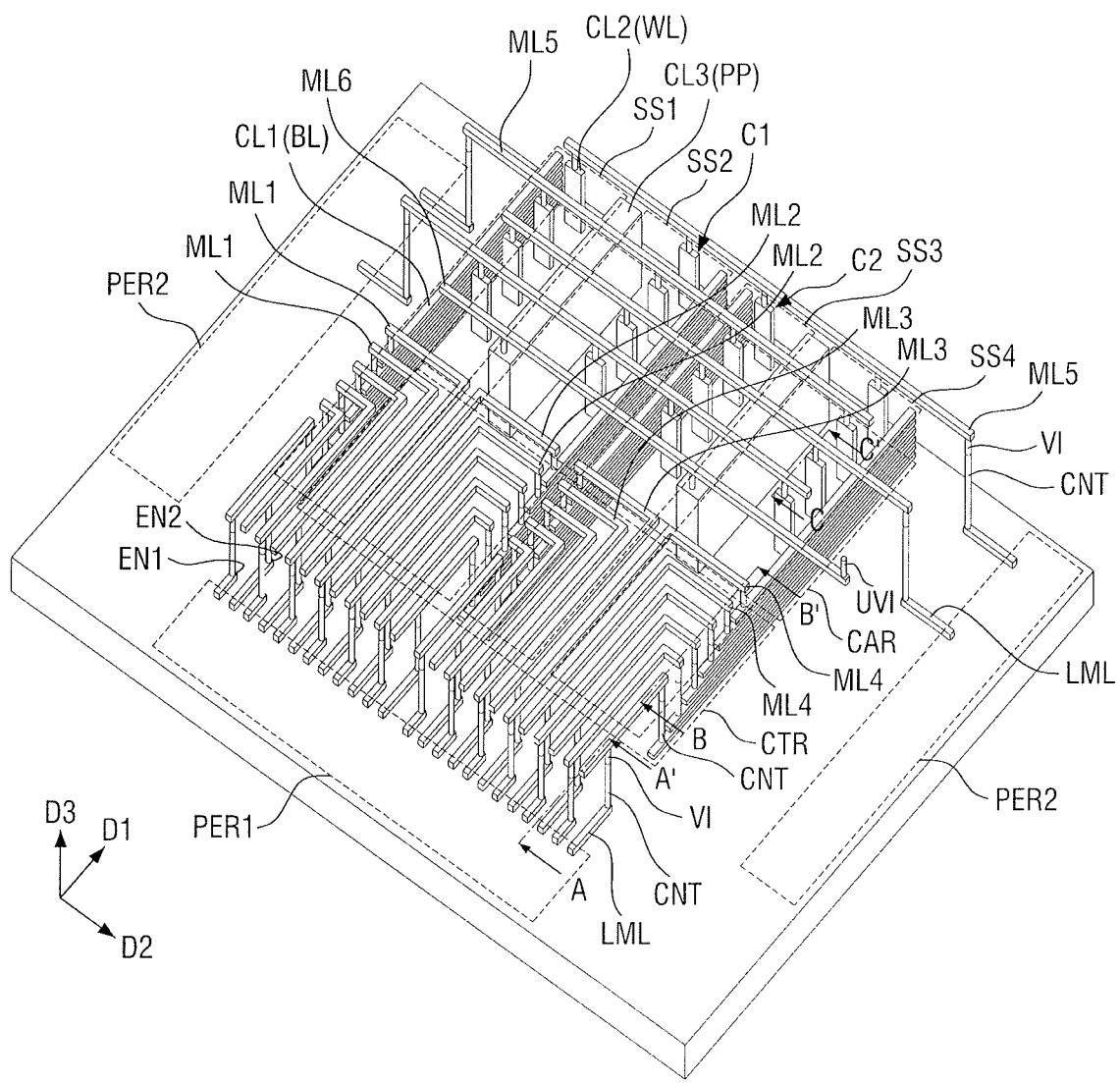
FIG. 4 illustrates a perspective view of a semiconductor memory device according to other embodiments of the present disclosure.
Figure 5A:
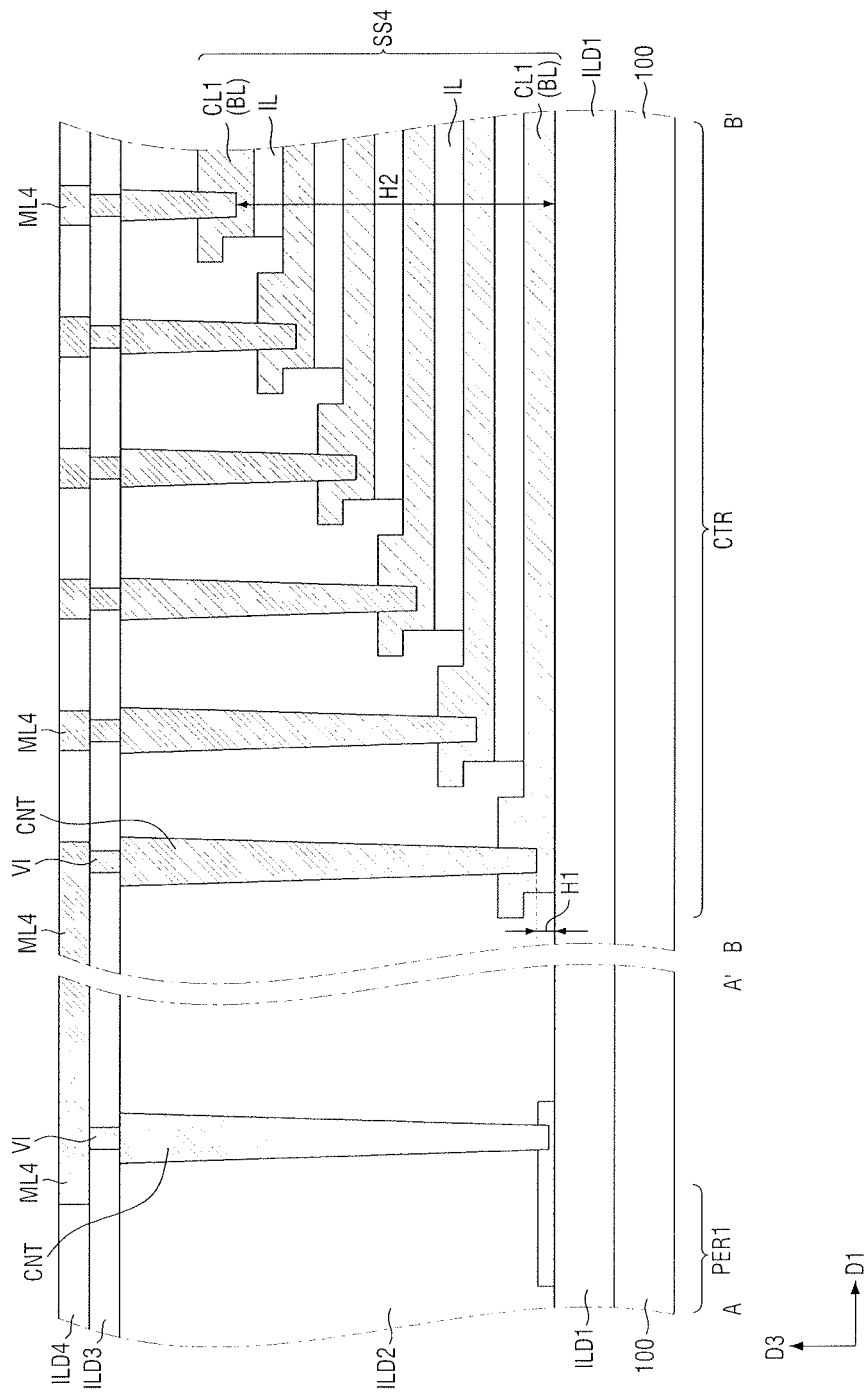
FIG. 5A illustrates a cross-sectional view taken along lines A-A' and B-B' of FIG. 4.

FIG. 4 is a perspective view of a semiconductor memory device according to some embodiments of the present disclosure. FIG. 5A is a cross-sectional view taken along lines A-A' and B-B' of FIG. 4. FIG. 5B is a cross-sectional view taken along line C-C' of FIG. 4. The semiconductor memory device of FIGS. 4 through 5B will hereinafter be described, focusing mainly on the differences with the semiconductor memory device of FIGS. 1, 2, and 3A through 3E.

Referring to FIGS. 4, 5A, and 5B, a substrate 100 may include a cell region CAR, a contact region CTR, a first peripheral circuit region PER1, and second peripheral circuit regions PER2. The contact region CTR may be between the cell region CAR and the first peripheral circuit region PER1.

The first peripheral circuit region PER1 and the second peripheral circuit regions PER2 may include peripheral transistors, resistors, and capacitors that are electrically connected to memory cell arrays. For example, the first peripheral circuit region PER1 may include sense amplifiers which are connected to bitlines BL in the cell region CAR, and the second peripheral circuit regions PER2 may include row decoders and/or sub-wordline drivers which are connected to wordlines WL in the cell region CAR.

Referring to FIG. 5A, an isolation film that defines an active region may be on the first peripheral circuit region PER1 of the substrate 100. Transistors may be in the active region and may be electrically connected to lower wires LML, which extend toward the cell region CAR over or on a first interlayer insulating film ILD1. The arrangement and the structure of the first peripheral circuit region PER1 may be substantially the same as the arrangement and the structure of the second peripheral circuit regions PER2.

First through fourth stack structures SS1 through SS4 may be on the cell region CAR and the contact region CTR of the substrate 100. The first through fourth stack structures SS1 through SS4 may be on the first interlayer insulating film ILD1. The first through fourth stack structures SS1 through SS4 may be located higher (in the third direction D3) than the peripheral transistors in the first peripheral circuit region PER1 and the second peripheral circuit regions PER2. For convenience, semiconductor patterns SP of each of the first through fourth stack structures SS1 through SS4 are not illustrated.

Contacts CNT that are in contact with first conductive lines CL1 on the contact region CTR may penetrate a second interlayer insulating film ILD2, which covers the first through fourth stack structures SS1 through SS4. Contacts CNT that are in contact with lower wires LML may be on the first peripheral circuit region PER1 and the second peripheral circuit regions PER2 to penetrate the second interlayer insulating film ILD2.

Contacts CNT that are in contact with the first conductive lines CL1 on the contact region CTR may be in contact with second regions CR2 of the first conductive lines CL1, as illustrated in FIG. 5A. The contacts CNT that are in contact with the first conductive lines CL1 on the contact region CTR may not be in contact with interlayer insulating films IL that are in contact with the bottom surfaces of the second regions CR2 of the first conductive lines CL1 or with the first interlayer insulating film ILD1.

Contacts CNT in the contact region CTR may be arranged or spaced apart in a first direction D1. The contacts CNT in the contact region CTR may be on the stepwise structures of the first through fourth stack structures SS1 through SS4. In an implementation, the level (e.g., distance from the substrate 100 in the third direction D3) of the bottom surfaces of the contacts CNT in the contact region CTR may increase closer to the cell region CAR. In an implementation, the bottom surfaces of contacts CNT proximate to the first peripheral circuit region PER1 may be at a first height H1, and the bottom surfaces of contacts CNT proximate to the cell region CAR may be at a second height H2. The second height H2 may be higher in a third direction D3 than the first height H1.

Contacts CNT that are in contact with lower wires LML in the first peripheral circuit region PER1 may be arranged in a zigzag fashion in a second direction D2. The contacts CNT may be arranged in a zigzag fashion on the first peripheral circuit region PER1, and process margins can be sufficiently secured between adjacent contacts CNT. In an implementation, a first lower wire LML in the first peripheral circuit region PER1 may have a first end EN1, and a second lower wire LML in the first peripheral circuit region PER1 may have a second end EN2. The second end EN2 may be closer to the contact region CTR (e.g., in the first direction D1) than the first end EN1 is to the contact region CTR.

Third and fourth interlayer insulating films ILD3 and ILD4 may be on the second interlayer insulating film ILD2. Vias VI may be in the third interlayer insulating film ILD3. First wires ML1, second wires ML2, third wires ML3, fourth wires ML4, fifth wires ML5, and sixth wires ML6 may be in the fourth interlayer insulating film ILD4. The first wires ML1, the second wires ML2, the third wires ML3, the fourth wires ML4, the fifth wires ML5, and the sixth wires ML6 may be in contact with the vias VI.

The first wires ML1, the second wires ML2, the third wires ML3, and the fourth wires ML4 may be electrically connected, over the contact region CTR, to first conductive lines CL1 of the first stack structure SS1, first conductive lines CL1 of the second stack structure SS2, first conductive lines CL1 of the third stack structure SS3, and first conductive lines CL1 of the fourth stack structure SS4 via contacts CNT and vias VI.

The first wires ML1 may be connected to the first conductive lines CL1 of the first stack structure SS1 over the contact region CTR. The second wires ML2 may be connected to the first conductive lines CL1 of the second stack structure SS2 over the contact region CTR. The third wires ML3 may be connected to the first conductive lines CL1 of the third stack structure SS3 over the contact region CTR. The fourth wires ML4 may be connected to the first conductive lines CL1 of the fourth stack structure SS4 over the contact region CTR.

The number of first wires ML1 may be the same as the number of first conductive lines CL1 of the first stack structure SS1. The number of second wires ML2 may be the same as the number of first conductive lines CL1 of the second stack structure SS2. The number of third wires ML3 may be the same as the number of first conductive lines CL1 of the third stack structure SS3. The number of fourth wires ML4 may be the same as the number of first conductive lines CL1 of the fourth stack structure SS4.

The first wires ML1, the second wires ML2, the third wires ML3, and the fourth wires ML4 may each include a first portion that extends in the first direction D1 and a second portion that extends in the second direction D2. For example, the first portions of the first wires ML1 may be a predetermined distance apart from one another in the second direction D2. The second portions of the first wires ML1 may be connected to contacts CNT above first conductive lines CL1.

The first wires ML1, the second wires ML2, the third wires ML3, and the fourth wires ML4 may extend from the contact region CTR to the first peripheral circuit region PER1. The first wires ML1, the second wires ML2, the third wires ML3, and the fourth wires ML4 may be electrically connected to lower wires LML via contacts CNT and vias VI over the first peripheral circuit region PER1.

The fifth wires ML5 may be electrically connected to second conductive lines CL2 via vias VI over the cell region CAR. The fifth wire ML5 may extend in the second direction D2. The fifth wire ML5 may extend from the cell region CAR to the second peripheral circuit regions PER2. The fifth wires ML5 may be electrically connected to lower wires LML via contacts CNT and vias VI over the second peripheral circuit regions PER2.

Each of the fifth wires ML5 may be connected in common to second conductive lines CL2 of the first through fourth stack structures SS1 through SS4. In an implementation, second conductive lines CL2 that are arranged in the first direction D1 in the second stack structure SS2 may form a first row C1, and second conductive lines CL2 that are arranged in the first direction D1 in the third stack structure SS3 may form a second row C2.

A first-second conductive line CL2 in the first row C1 and a first-second conductive line CL2 in the second row C2 may be arranged or spaced apart in the second direction D2. The first-second conductive line CL2 in the first row C1 and the first-second conductive line CL2 in the second row C2 may be connected in common to a first-fifth wire ML5. A second-second conductive line CL2 in the first row C1 and a second-second conductive line CL2 in the second row C2 may be arranged or spaced apart in the second direction D2. The second-second conductive line CL2 in the first row C1 and the second-second conductive line CL2 in the second row C2 may be connected in common to a second-fifth wire ML5.

The first-fifth wire ML5 may extend over the second peripheral circuit region PER2 on one side of the cell region CAR. The second-fifth wire ML5 may extend over the second peripheral circuit region PER2 on the other side of the cell region CAR.

The sixth wires ML6 may be electrically connected to third conductive lines CL3 via vias VI over the cell region CAR. The sixth wire ML6 may extend in the second direction D2. The sixth wire ML6 may be connected to upper wires via upper vias UVI.

Lower wires LML, contacts CNT, vias VI, the first wires ML1, the second wires ML2, the third wires ML3, the fourth wires ML4, the fifth wires ML5, and the sixth wires ML6 may include a metal, e.g., aluminum, copper, tungsten, molybdenum, or cobalt.

Figure 6:
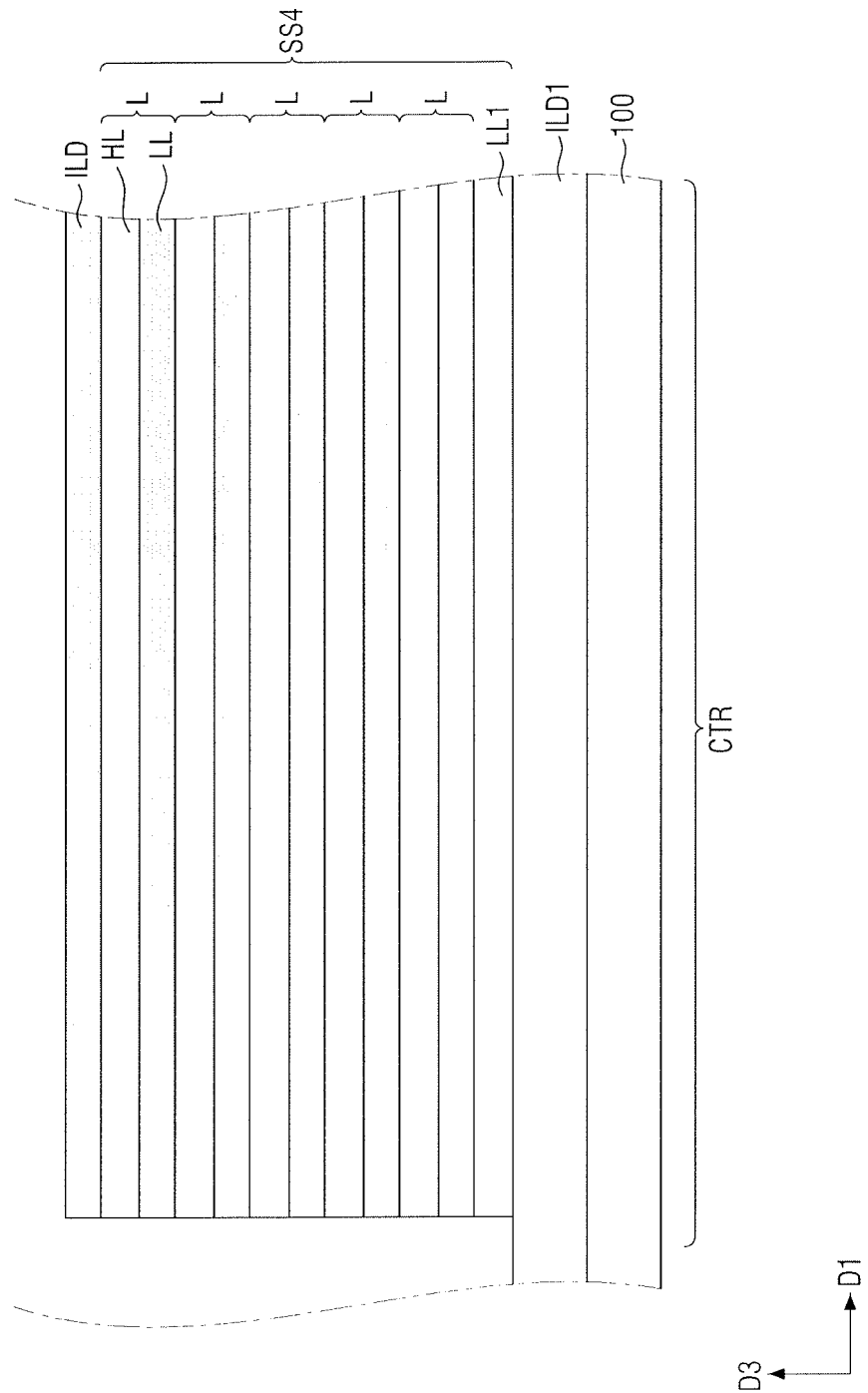
FIG. 6 illustrates a cross-sectional view of a stage in a method of manufacturing a semiconductor device according to some embodiments of the present disclosure.

FIG. 6 is a cross-sectional view illustrating a stage in a method of fabricating a contact region CTR of a semiconductor memory device according to some embodiments of the present disclosure.

Referring to FIG. 6, a stack structure in which a first interlayer insulating film ILD1, a first lower film LL1, a plurality of pad films L, and an interlayer insulating film ILD are sequentially stacked may be formed on a substrate 100.

The pad films L, which extend in the same direction, e.g., in a first direction D1, may be stacked on the first lower film LL1. In an implementation, as illustrated in FIG. 6 five pad films L may be provided, or the number of pad films L may be different.

Each of the pad films L may include an upper pad film HL and a lower pad film LL, and the interlayer insulating film ILD may be formed on the uppermost pad film L. The upper pad films HL of the pad films L may be formed of a conductive material or a semiconductor material, e.g., silicon, germanium, silicon-germanium, or IGZO.

Each of the lower pad films LL of the pad films L may include an insulating material, e.g., a silicon oxide film, a silicon nitride film, a silicon oxynitride film, a carbon-based silicon oxide film, a carbon-based silicon nitride film, or a carbon-based silicon oxynitride film, or may be formed of a conductive material or a semiconductor material, e.g., silicon, germanium, silicon-germanium, or IGZO.

Manufacturing processes that will be described below may be further performed depending on the material of the lower pad films LL of the pad films L, and the upper pad films HL and the lower pad films LL of the pad films L may have similar electrical and chemical properties, but may include different materials.

Figure 7:
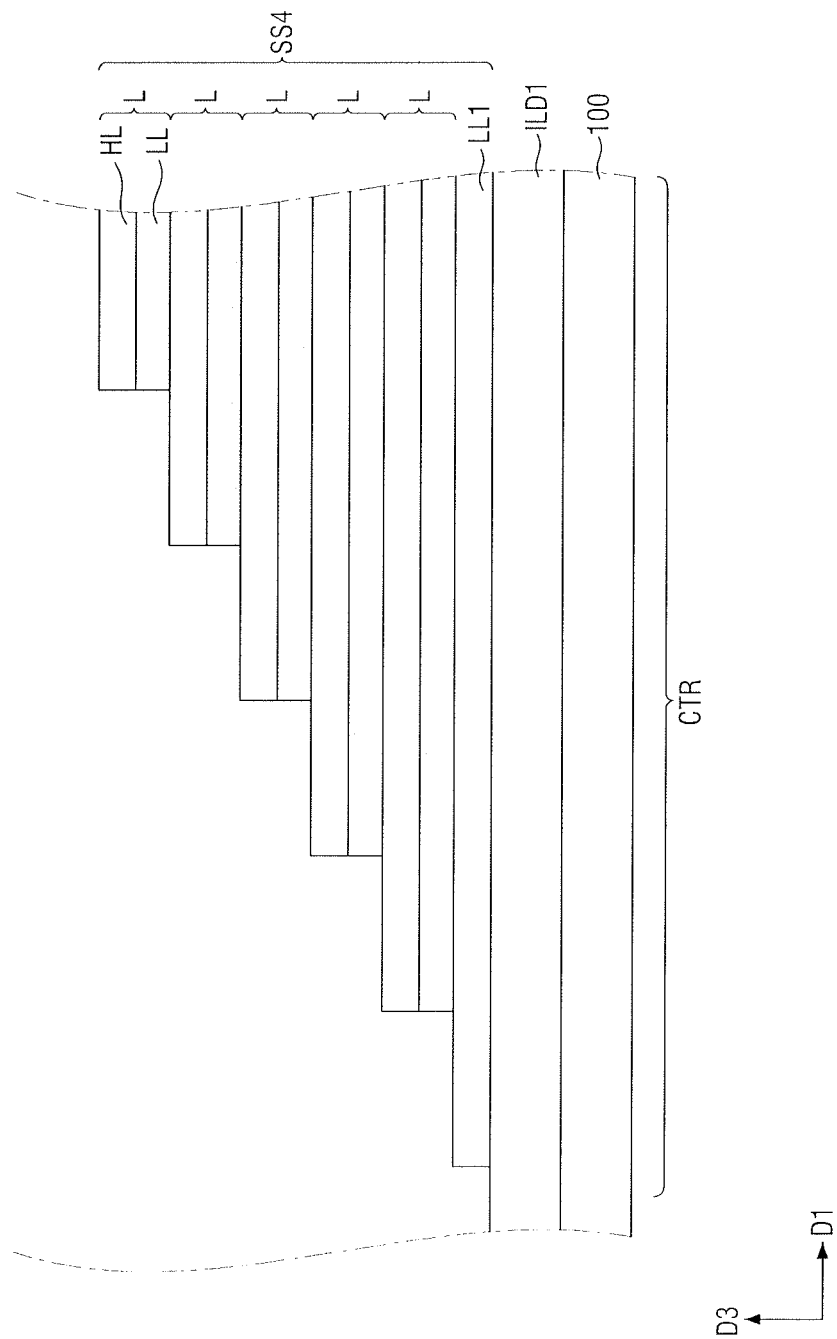

FIGS. 7 and 8 are cross-sectional views illustrating stages in a method of fabricating a contact region of a semiconductor memory device according to some embodiments of the present disclosure.

Referring to FIG. 7, the interlayer insulating film ILD and parts of the pad films L may be removed to form the stack structure into a stepwise stack structure.

The entire upper pad film HL of the uppermost pad film L may be exposed, and the upper pad films HL of the other pad films L and the first lower film LL1 may be partially exposed. Sides of the lower pad films LL of the pad films L may be exposed.

The formation of the stepwise stack structure may include performing a trimming process on the stack structure. In an implementation, the trimming process may include forming a mask pattern that covers a thin-film structure in a cell region CAR and in a contact region CTR, etching part of the thin-film structure, reducing the horizontal size of the mask pattern, and the steps of etching part of the thin-film structure and reducing the horizontal size of the mask pattern may be repeatedly performed. As a result of the trimming process, the stack structure may be formed into a stepwise stack structure that descends in a direction from the contact region CTR to a first peripheral circuit region PER1.

Referring to FIG. 8, a pad silicon film PS may be stacked along the top surfaces and the sides of the stepwise stack structure, in the contact region CTR. The pad silicon film PS may include a silicon film of a first conductivity type (e.g., an n type). In an implementation, the pad silicon film PS may be undoped or may have a second conductivity type (e.g., a p type), which is different from the first conductivity type. The pad silicon film PS may include the same material as the upper pad films HL of the pad films L.

The thickness of the pad silicon film PS may be uniform throughout the top surfaces and the sides of the stepwise stack structure and may be formed by, e.g., atomic layer deposition (ALD), plasma-enhanced chemical vapor deposition (PE-CVD), atmospheric pressure chemical vapor deposition (AP-CVD), or flowable chemical vapor deposition (FCVD).

Figure 9B:
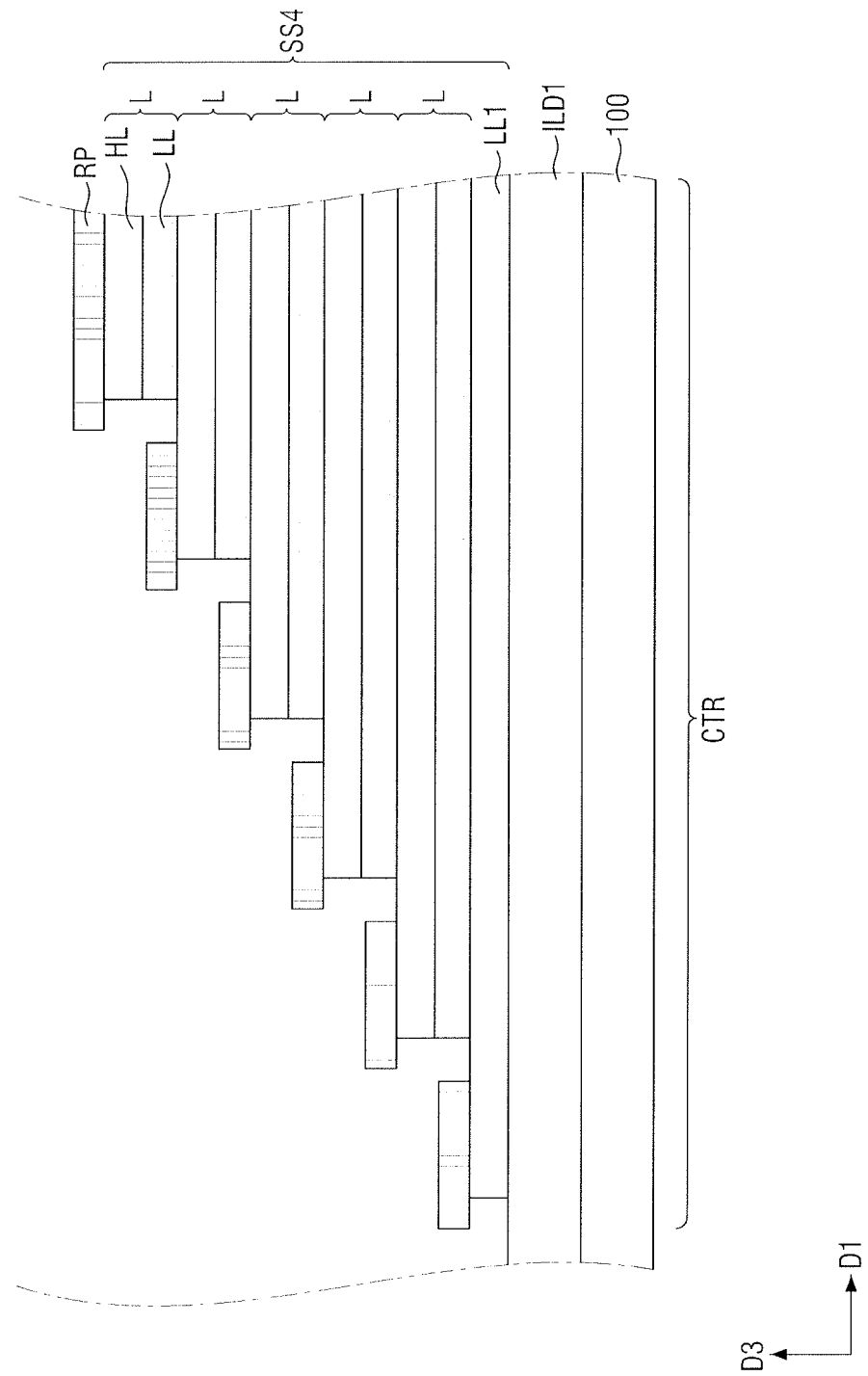

FIGS. 9A and 9B are cross-sectional views illustrating stages in the method of fabricating the contact region CTR of the semiconductor memory device according to some embodiments of the present disclosure.

FIGS. 9A and 9B illustrate how to remove the pad silicon film PS from the sides of the stack structure in the contact region CTR. Referring to FIGS. 9A and 9B, carbon ions may be implanted into the pad silicon film PS by performing ion implantation in a direction that is aligned with a third direction D3. The pad silicon film PS may be divided into regions including carbon impurities and regions not including carbon impurities depending on the arrangement of the pad silicon film PS and the direction in which carbon ions are implanted.

Parts of the pad silicon film PS on the sides of the stack structure in the contact region CTR may not include carbon impurities depending on the direction in which carbon ions are implanted. Parts of the pad silicon film PS that do not include carbon impurities may be removed by wet etching, and parts of the pad silicon film PS that include carbon impurities may remain unremoved. The remaining/unremoved parts of the pad silicon film PS may cover the upper pad films HL and the lower pad films LL as raised pads RP. In an implementation, an ammonia deionized mixture (ADM) solution may be used to wet-etch the pad silicon film PS.

Figure 10A:
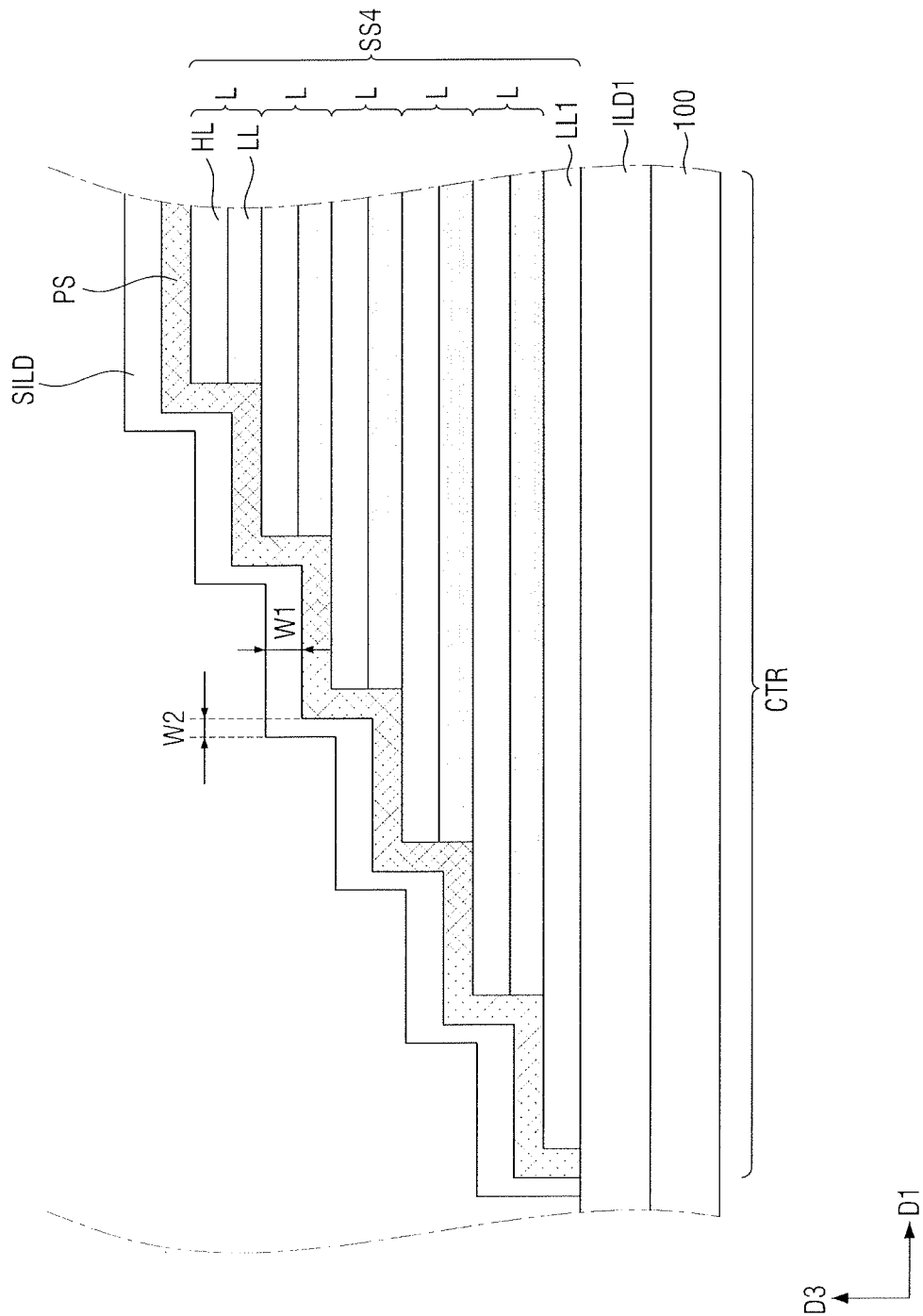
FIGS. 10A through 10C illustrate cross-sectional views of stages in a method of fabricating a contact region of a semiconductor memory device according to other embodiments of the present disclosure.
Figure 10B:
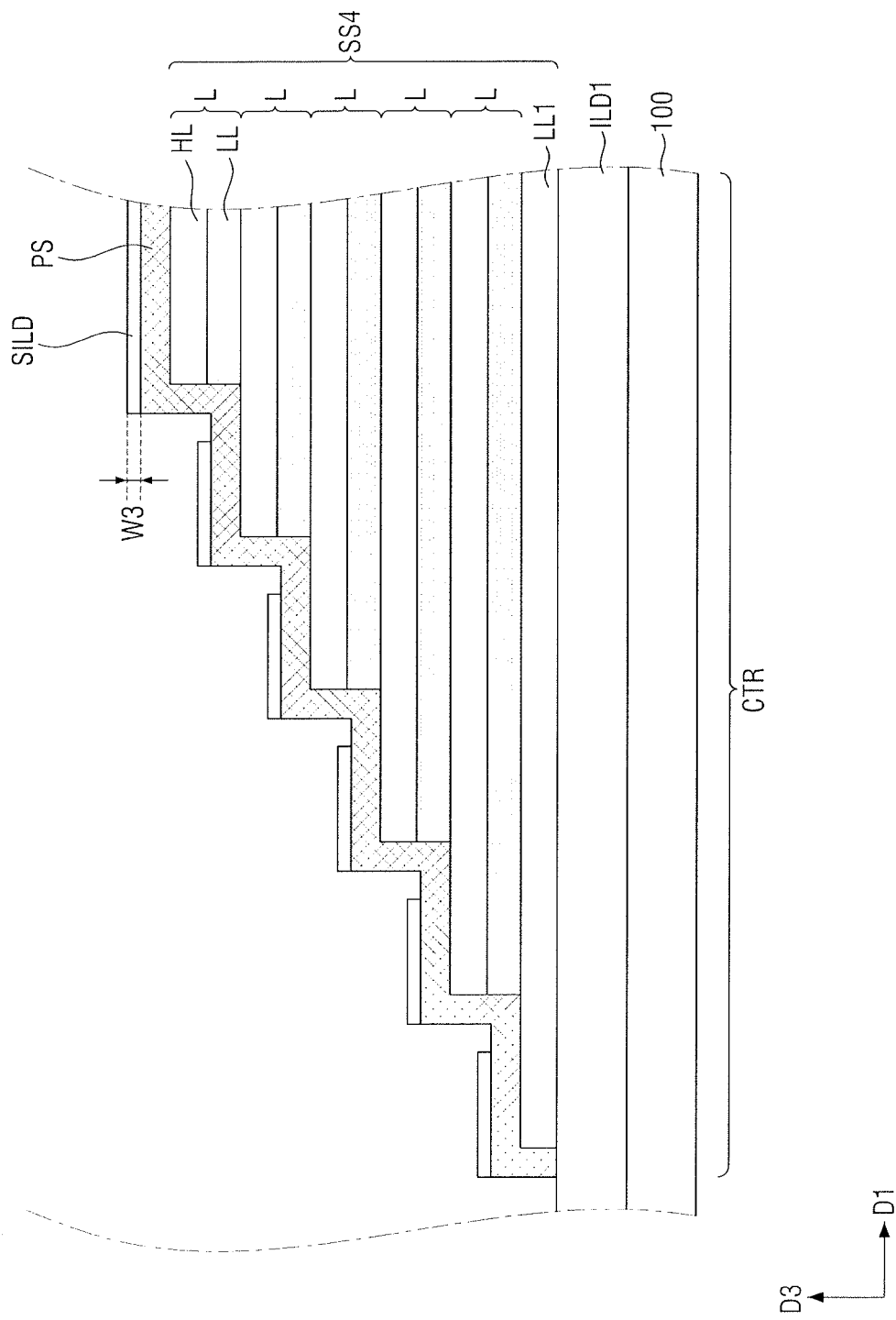
Figure 10C:
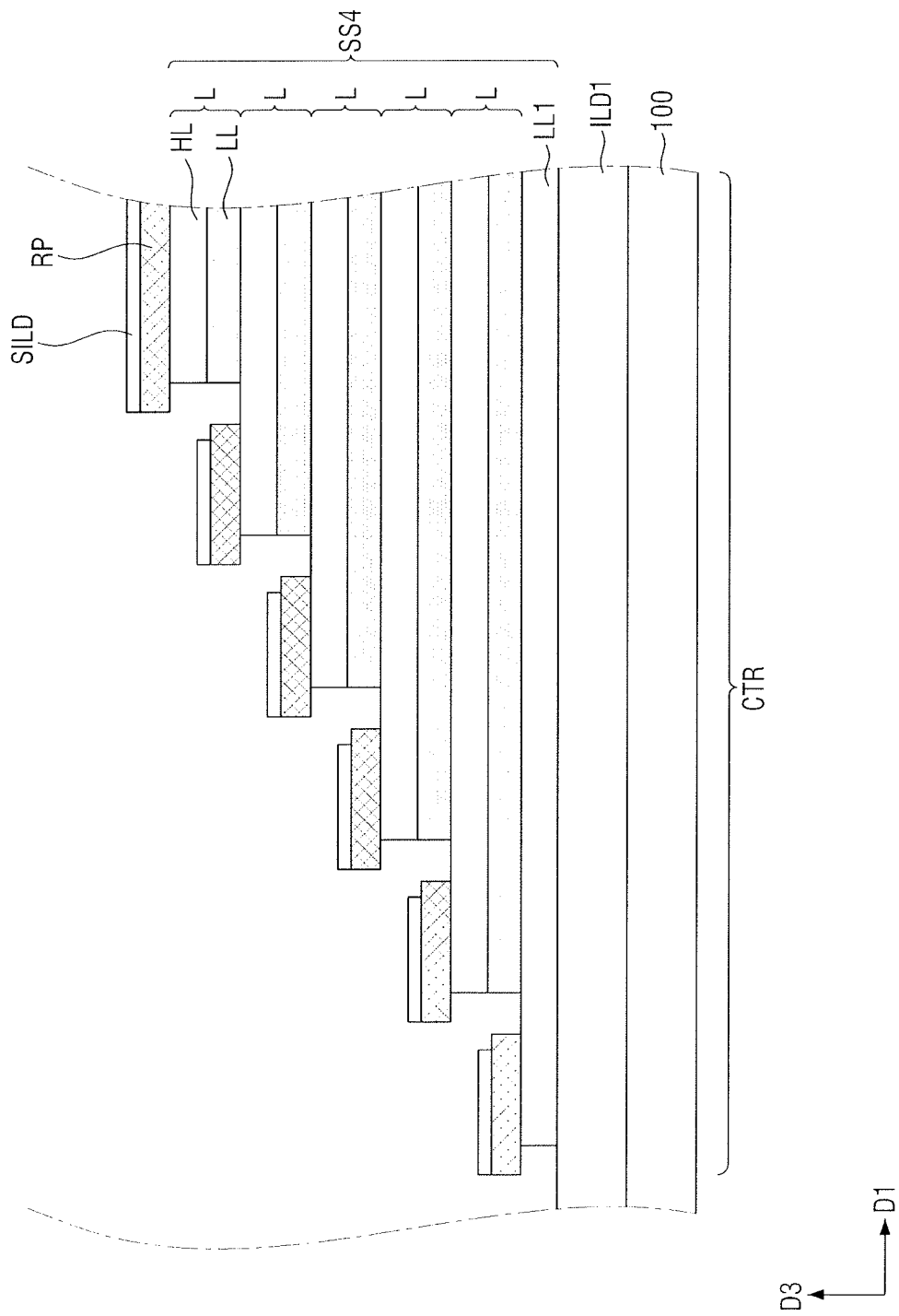

FIGS. 10A, 10B, and 10C are cross-sectional views illustrating stages in a method of fabricating a contact region CTR of a semiconductor memory device according to other embodiments of the present disclosure.

FIGS. 10A, 10B, and 10C illustrate how to remove a pad silicon film PS from sides of a stack structure in a contact region CTR according to other embodiments of the present disclosure. Referring to FIGS. 10A through 10C, a sacrificial insulating film SILD having a low step coverage may be stacked along top surfaces and sides of the pad silicon film PS. In an implementation, the sacrificial insulating film SILD may include, e.g., silicon oxide.

Due to the low step coverage of the sacrificial insulating film SILD, a width or thickness W1 (e.g., in the third direction D3) of parts of the sacrificial insulating film SILD on the top surfaces of the pad silicon film PS may be greater than a width or thickness W2 (e.g., in the first direction D1) of parts of the sacrificial insulating film SILD on the sides of the pad silicon film PS.

The parts of the sacrificial insulating film SILD on the top surfaces of the pad silicon film PS may be etched by as much as the width W2 so that the sacrificial insulating film SILD may remain only on parts of the top surfaces of the pad silicon film PS to have a width or thickness W3.

The remaining parts of the sacrificial insulating film SILD may serve as a passivation film for the pad silicon film PS so that parts of sides of pad films L may be removed by wet etching, and parts of the pad silicon film PS on the top surfaces of the pad films L and on the top surface of a first lower film LL1 may remain unremoved (e.g., forming raised pads RP). In an implementation, an ADM solution may be used to wet-etch the pad silicon film PS. As a result of wet etching, the remaining parts of the sacrificial insulating film SILD may be removed.

Figure 11:
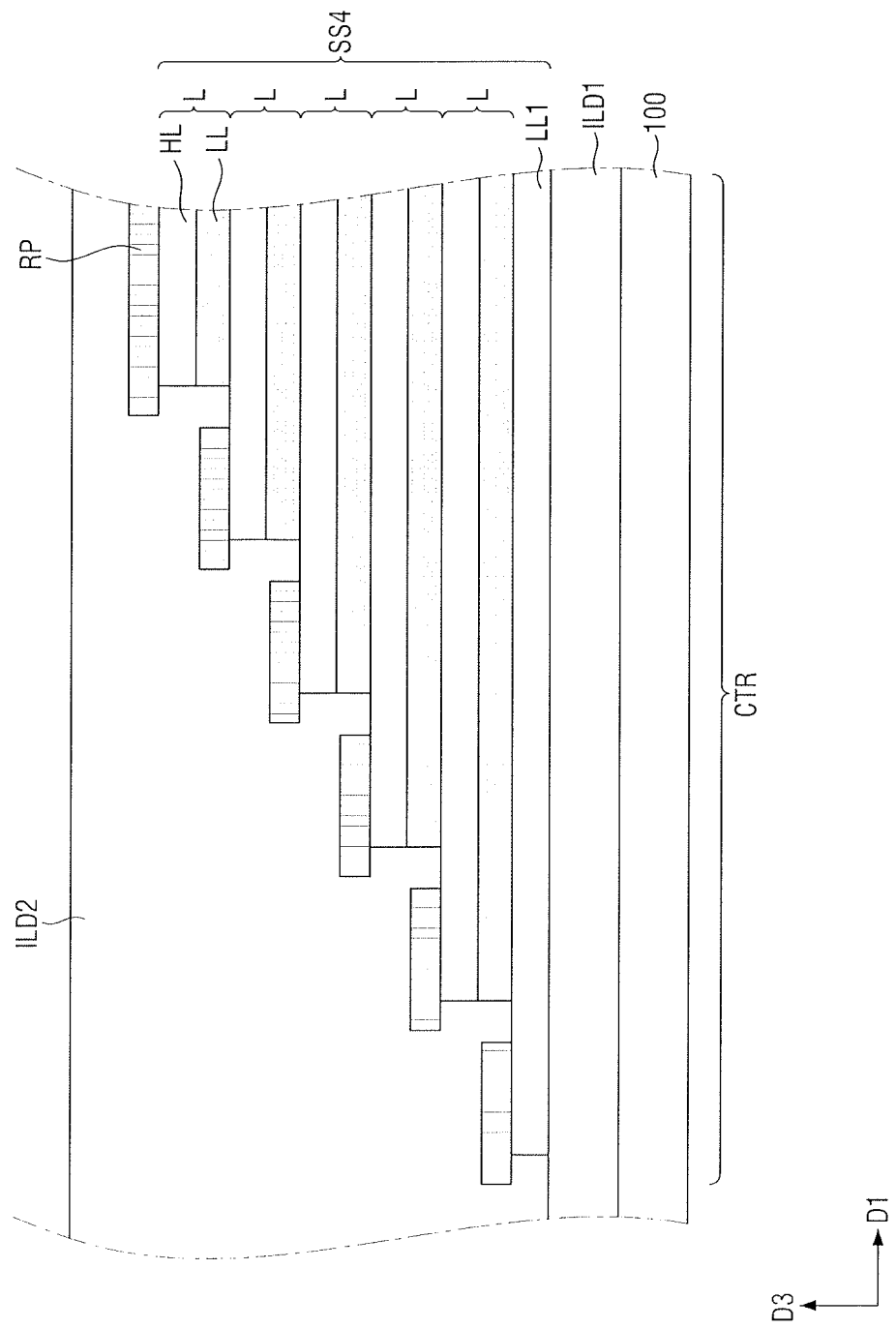
FIGS. 11 through 15 illustrate cross-sectional view of stages in a method of fabricating a contact region of a semiconductor memory device according to some embodiments of the present disclosure.

Referring to FIG. 11, after the removal of the pad silicon film PS from the sides of the pad films L, the contact region CTR may be filled with a second interlayer insulating film ILD2. The second interlayer insulating film ILD2 may include an insulating material, e.g., a silicon oxide film, a silicon nitride film, a silicon oxynitride film, a carbon-based silicon oxide film, a carbon-based silicon nitride film, or a carbon-based silicon oxynitride film.

The second interlayer insulating film ILD2 may cover the uppermost pad film L and may be formed in the spaces between the raised pads RP and the pad films L. The second interlayer insulating film ILD2 may also be formed in the space between the first lower film LL1 and the lowermost raised pad RP.

Figure 12:
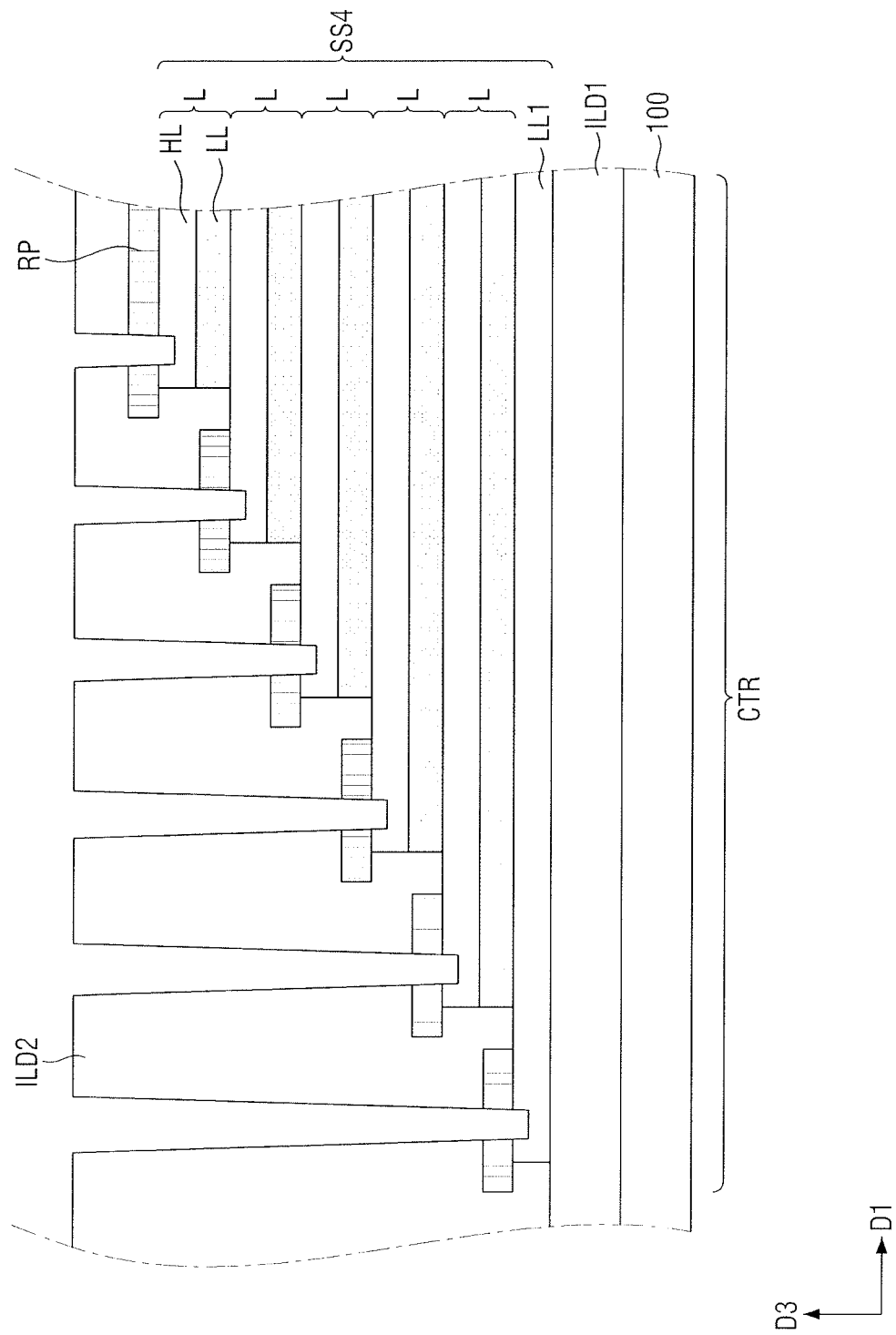

Referring to FIG. 12, contact holes may be formed in the upper pad films HL of the pad films L and in the first lower film LL1 through the second interlayer insulating film ILD2 and through the raised pads RP. The contact holes may be formed in a second region CR2 and may be arranged or spaced apart in the first direction D1.

The depth of the contact hole formed in the first lower film LL1 may be greater than the depths of the contact hole formed in the upper pad film HL of the uppermost pad film L.

Figure 13:
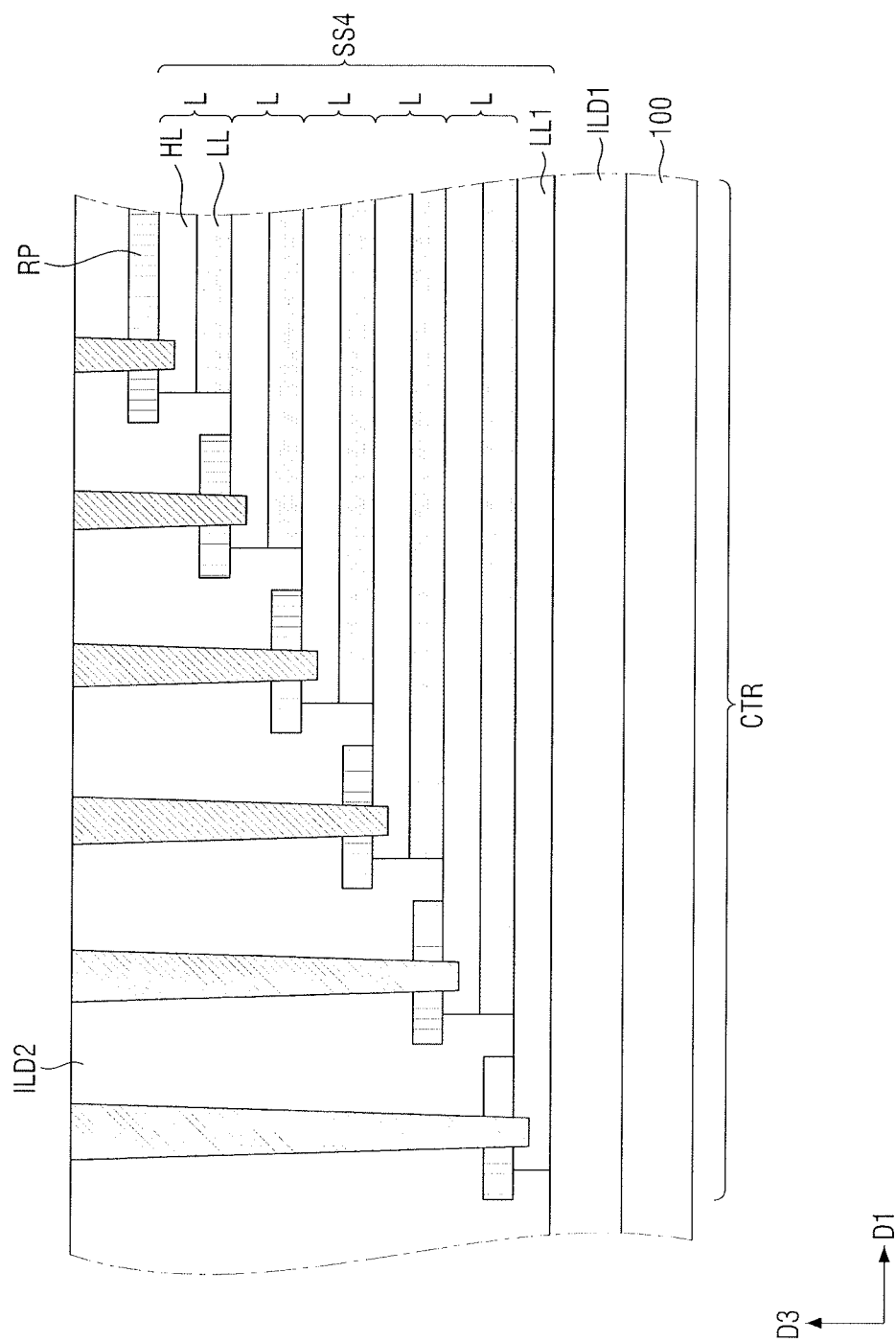

Referring to FIG. 13, contacts may be formed in the contact holes using a metal. In an implementation, the metal may include, e.g., tungsten (W).

In a case where the lower pad films LL of the pad films L are formed of a conductive material or a semiconductor material, e.g., silicon, germanium, silicon-germanium, or IGZO, the lower pad films LL of the pad films L may be replaced with insulating films, e.g., silicon oxide films, silicon nitride films, silicon oxynitride films, carbon-based silicon oxide films, carbon-based silicon nitride films, or carbon-based silicon oxynitride films.

Figure 14:
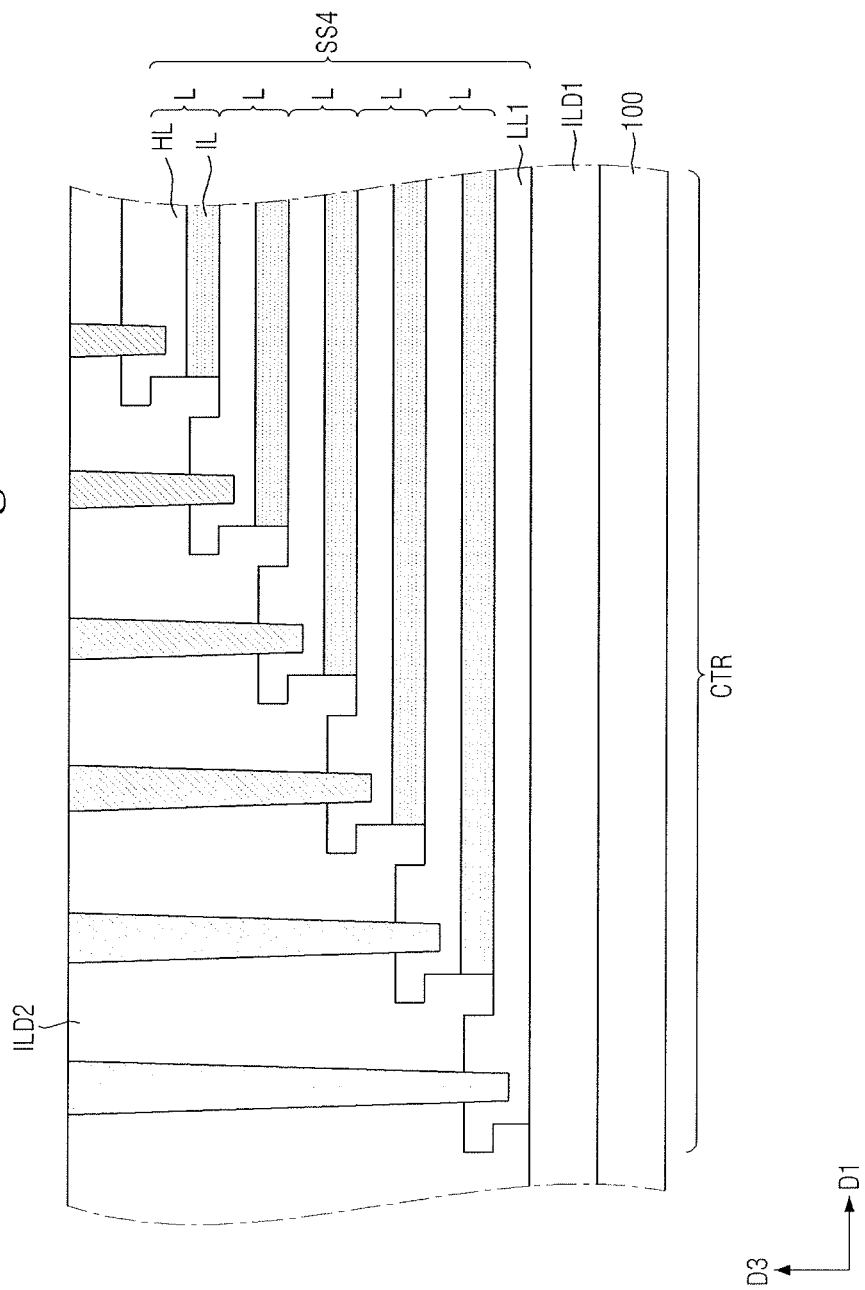
Figure 15:
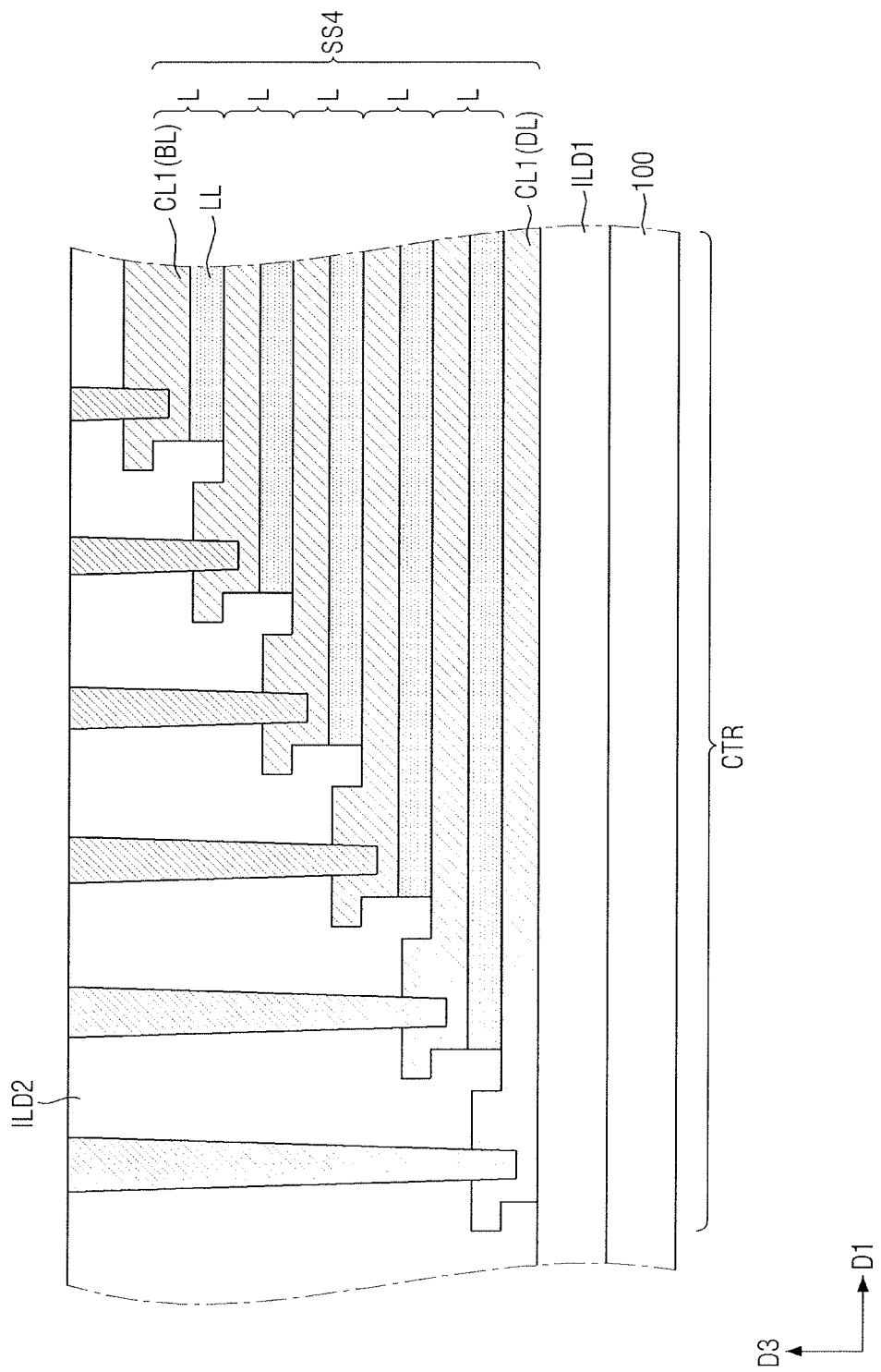

Referring to FIGS. 14 and 15, the lower pad films LL of the pad films L may be formed as interlayer insulating films IL, and the upper pad films HL of the pad films L and the raised pads RP may be replaced with first conductive lines CL1 that are filled with a conductive material. The conductive material may include, e.g., a doped semiconductor material, a conductive metal nitride, a metal, or a metal-semiconductor compound.

Figure 16:
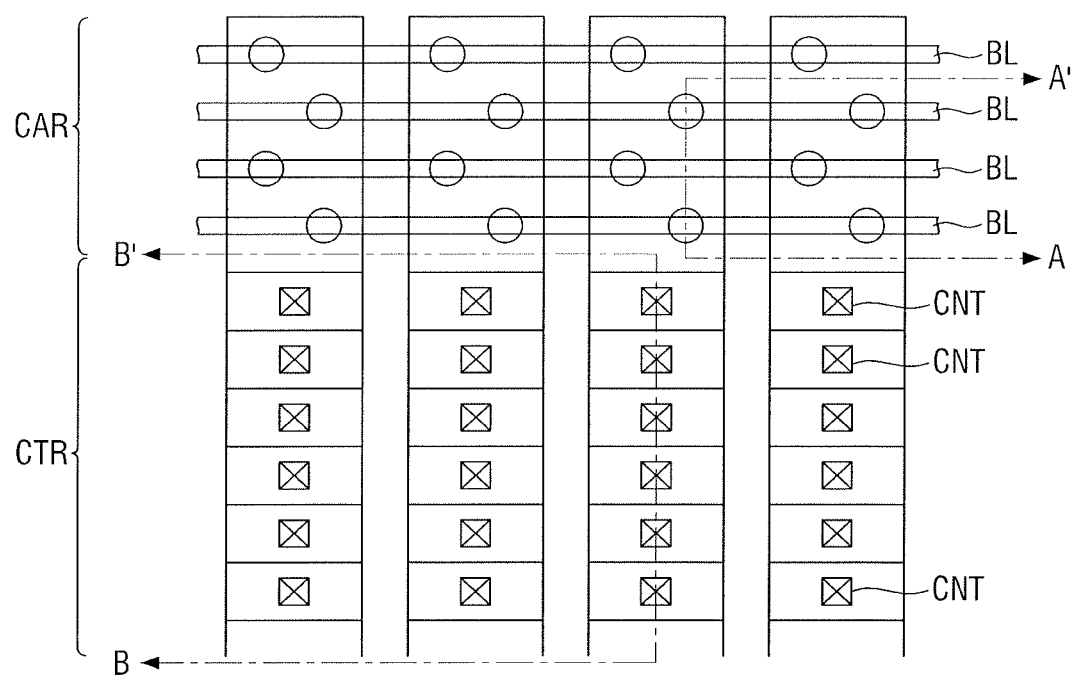
FIG. 16 illustrates a plan view of a semiconductor memory device according to other embodiments of the present disclosure.
Figure 17:
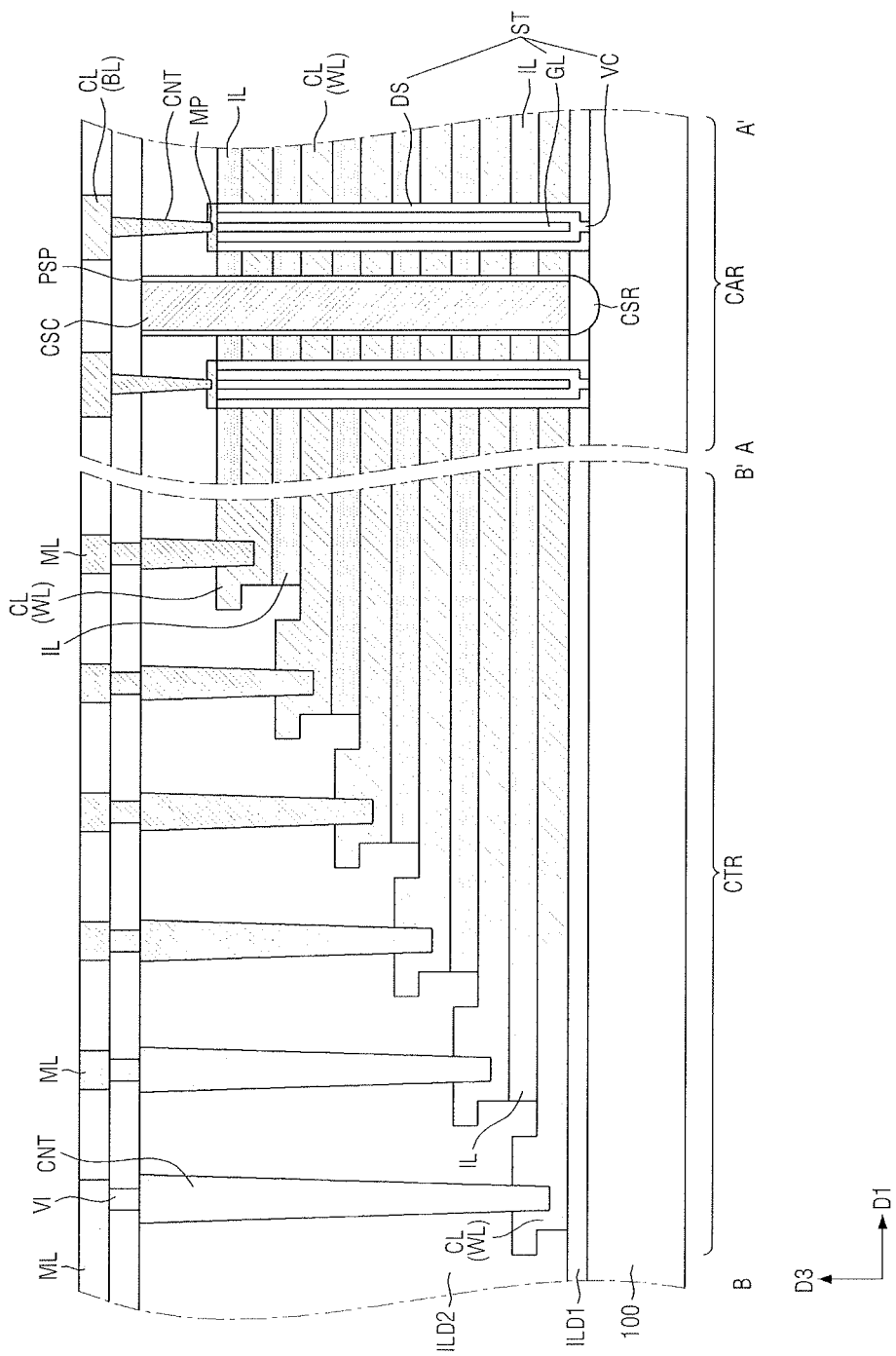
FIG. 17 illustrates a cross-sectional view taken along lines A-A' and B-B' of FIG. 16.

FIG. 16 is a plan view of a semiconductor memory device according to other embodiments of the present disclosure. FIG. 17 is a cross-sectional view taken along lines A-A' and B-B' of FIG. 16. The semiconductor memory device of FIGS. 16 and 17 will hereinafter be described, focusing mainly on the differences with the semiconductor memory device of FIGS. 1, 2, 3A through 3E, 4, 5A, and 5B.

Referring to FIGS. 16 and 17, first conductive lines CL1 that extend in the first direction D1 over a contact region CTR may serve as wordlines WL, not as bitlines BL, and spacers PSP, a common source contact CSC, and vertical structures ST that extend in the third direction D3 in a cell region CAR may penetrate the first conductive lines CL1.

In an implementation, the common source contact CSC may include, e.g., tungsten, copper, aluminum, titanium, or tantalum. The spacers PSP may surround the outer sidewalls of the common source contact CSC. In an implementation, the spacers PSP may include an insulating material, e.g., a silicon oxide film or a silicon nitride film.

The vertical structures ST may include vertical channel layers VC, vertical insulating patterns GL, and information storage elements DS in the vertical structures ST. Each of the vertical channel layers VC may be in the shape of a hollow pipe, a cylinder, or a cup. The vertical channel layers VC may be electrically connected to a substrate 100. Each of the vertical channel layers VC may include single film or a plurality of films. Each of the vertical channel layers VC may include, e.g., a monocrystalline silicon film, an organic semiconductor film, or a carbon nano structure.

The vertical insulating patterns GL may be in the spaces surrounded by the vertical channel layers VC. Each of the vertical insulating patterns GL may include an insulating material. In an implementation, each of the vertical insulating patterns GL may include, e.g., a silicon oxide film, a silicon nitride film, or a silicon oxynitride film.

The information storage elements DS in the vertical structures ST may be between the vertical channel layers VC and the first conductive lines CL1. The information storage elements DS in the vertical structures ST may extend in the third direction D3 along the outer sides of the vertical channel layers VC. In an implementation, the information storage elements DS in the vertical structures ST may have a shape that surrounds the outer sides of the vertical channel layers VC.

Pads MP may be above or on the vertical channel layers VC, the information storage elements DS in the vertical structures ST, and the vertical insulating patterns GL. The pads MP may be electrically connected to the vertical channel layers VC. The pads MP may include a conductive material or a semiconductor material doped with impurities of a different conductivity type from the vertical channel layers VC.

Second conductive lines CL2 may be electrically connected to the pads MP via contacts CNT. The second conductive lines CL2 may operate as gate electrodes and may extend in a second direction D2 across the semiconductor memory device of FIGS. 16 and 17.

By way of summation and review, in addition to DRAMs that are vertically stacked, contacts may be landed in a memory device having a multilayer structure in a stepwise pad process. A phenomenon may arise in which upper pads may be punched through and may be connected to pads directly therebelow, because of upper contacts and lower contacts being etched at different rates.

According to an embodiment, open pad areas may be selectively thickened during the stepwise pad process so that punching defects can be minimized.

One or more embodiments may provide a semiconductor memory device having a vertical structure in which open areas are selectively thickened during a stepwise pad process.

One or more embodiments may provide a method of manufacturing a semiconductor memory device having a vertical structure in which open areas are selectively thickened during a stepwise pad process.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor memory device, comprising:
    first-first conductive lines on a substrate;
    second-first conductive lines on the first-first conductive lines;
    first interlayer insulating films between the first-first conductive lines and the second-first conductive lines;
    first contacts connected to the first-first conductive lines;
    second contacts connected to the second-first conductive lines;
    wherein:
        the first-first conductive lines protrude in a first direction beyond the second-first conductive lines;
        the first-first conductive lines include first regions having a first thickness, second regions having a second thickness, the second thickness being greater than the first thickness, and third regions having a third thickness, the third thickness being smaller than the first thickness and smaller than the second thickness, the second regions of the first-first conductive lines are between the first regions of the first-first conductive lines and the third regions of the first-first conductive lines, the second-first conductive lines include first regions and second regions, the second regions of the second-first conductive lines are directly connected to the first regions of the second-first conductive lines and include ends of the second-first conductive lines, a thickness of the first regions of the second-first conductive lines is greater than a thickness of the second regions of the second-first conductive lines, semiconductor patterns connected to the first-first conductive lines and extending in a second direction, which is different from the first direction;

gate electrodes extending in a third direction, which is different from the first and second directions, adjacent to the semiconductor patterns; and capacitors connected to the semiconductor patterns, wherein:

the semiconductor patterns include first impurity regions, second impurity regions, and channel regions, the channel regions being between the first impurity regions and the second impurity regions, the first-first conductive lines are electrically connected to the first impurity regions, the gate electrodes are adjacent to the channel regions, the capacitors are connected to the second impurity regions, the first contacts contact the second regions of the first-first conductive lines and bottom surfaces of the first contacts are lower than top surfaces of the first regions of the first-first conductive lines, side surfaces of the first regions of the second-first conductive lines are substantially coplanar with side surfaces of the first interlayer insulating films, and the top surfaces of the first regions of the first-first conductive lines contacts the first interlayer insulating films.

2. The semiconductor memory device as claimed in claim 1, wherein parts of the first regions of the first-first conductive lines protrude in the first direction beyond the side surfaces of the first interlayer insulating films.

3. The semiconductor memory device as claimed in claim 1, wherein the second regions of the second-first conductive lines protrude in the first direction beyond the side surfaces of the first interlayer insulating films.

4. The semiconductor memory device as claimed in claim 1, further comprising second interlayer insulating films between the substrate and the first-first conductive lines, wherein side surfaces of the second interlayer insulating films are aligned along a vertical direction with side surfaces of the second regions of the first-first conductive lines.

5. The semiconductor memory device as claimed in claim 1, wherein the second regions of the first-first conductive lines are directly connected to the first regions of the first-first conductive lines and directly connected to the third regions of the first-first conductive lines.

6. The semiconductor memory device as claimed in claim 1, wherein:

a height of bottom surfaces of the first regions of the first-first conductive lines from a top surface of the substrate is the same as a height of bottom surfaces of the second regions of first-first conductive lines from the top surface of the substrate, and a height of the bottom surfaces of the second regions of the first-first conductive lines from the top surface of the substrate is smaller than a height of bottom surfaces of the third regions of the first-first conductive lines from the top surface of the substrate.

7. The semiconductor memory device as claimed in claim 1, wherein the third regions of the first-first conductive lines protrude in the first direction from side surfaces of the second regions of the first-first conductive lines.

8. The semiconductor memory device as claimed in claim 1, further comprising vertical structures penetrating the first-first conductive lines and the second-first conductive lines, wherein the vertical structures include vertical insulating patterns, vertical channel layers, which extend along outer sides of the vertical insulating patterns, and charge storage films, which are between the vertical channel layers and the first-first conductive lines.

9. A semiconductor memory device, comprising:

first semiconductor patterns and second semiconductor patterns extending in a second direction over a substrate, the first semiconductor patterns being spaced apart from the second semiconductor patterns in a third direction, which is different from the second direction;

first-first conductive lines connected to the first semiconductor patterns and extending in a first direction, which is different from the second direction and the third direction;

second-first conductive lines connected to the second semiconductor patterns and extending in the first direction;

interlayer insulating films between the first-first conductive lines and the second-first conductive lines;

gate electrodes extending in the third direction, the gate electrodes being adjacent to the first semiconductor patterns and the second semiconductor patterns;

contacts connected to the first-first conductive lines; and capacitors connected to the first semiconductor patterns, wherein:

the second-first conductive lines extend along the first-first conductive lines over the first-first conductive lines, the first-first conductive lines protrude in the first direction beyond the second-first conductive lines, the first-first conductive lines include first regions having a first thickness in the third direction and second regions having a second thickness in the third direction, the second thickness being greater than the first thickness, the second-first conductive lines include first regions and second regions, the second regions of the second-first conductive line are directly connected to the first regions of the second-first conductive lines and include ends of the second-first conductive lines, a thickness of the first regions of the second-first conductive lines is greater than a thickness of the second regions of the second-first conductive lines, the contacts are connected to the second regions of the first-first conductive lines, the first semiconductor patterns include first impurity regions, second impurity regions, and channel regions, the channel regions being between the first impurity regions and the second impurity regions, the first-first conductive lines are electrically connected to the first impurity regions, the gate electrodes are adjacent to the channel regions, the capacitors are connected to the second impurity regions, bottom surfaces of the contacts are lower than top surfaces of the first regions of the first-first conductive lines, side surfaces of the first regions of the second-first conductive lines are substantially coplanar with side surfaces of the interlayer insulating films, and the top surfaces of the first regions of the first-first conductive lines contact the interlayer insulating films.

10. The semiconductor memory device as claimed in claim 9, wherein parts of the first regions of the first-first conductive lines protrude in the first direction beyond the side surfaces of the interlayer insulating films.

11. The semiconductor memory device as claimed in claim 9, wherein the second-first conductive lines do not overlap, in the third direction, with the second regions of the first-first conductive lines.

12. The semiconductor memory device as claimed in claim 9, wherein:

the first-first conductive lines further include third regions, which protrude beyond side surfaces of the second regions of the first-first conductive lines in the first direction, and a third thickness in the third direction of the third regions of the first-first conductive lines is smaller than the first thickness and smaller than the second thickness.

13. A semiconductor memory device, comprising:

a plurality of semiconductor patterns stacked in a third direction on a substrate and extending in a second direction that is different from the third direction;

a plurality of first conductive lines connected to the plurality of semiconductor patterns, respectively, and extending in a first direction that is different from the second direction and the third direction;

a plurality of first gate electrodes adjacent to the plurality of semiconductor patterns, respectively, and extending in the third direction; and capacitors connected to the plurality of semiconductor patterns, wherein:

the plurality of first conductive lines include first-first conductive lines and second-first conductive lines, the second-first conductive lines being adjacent in the third direction to the first-first conductive lines, the first-first conductive lines include protruding parts that protrude in the first direction beyond the second-first conductive lines, a thickness in the third direction of overlapping parts of the first-first conductive lines that overlap in the third direction with the second-first conductive lines is smaller than a thickness in the third direction of the protruding parts of the first-first conductive lines, interlayer insulating films are between the overlapping parts of the first-first conductive lines and the second-first conductive lines, the second-first conductive lines include first regions and second regions, the second regions of the second-first conductive lines are directly connected to the first regions of the second-first conductive lines and include ends of the second-first conductive lines, a thickness of the first regions of the second-first conductive lines is greater than a thickness of the second regions of the second-first conductive lines, the plurality of semiconductor patterns include first impurity regions, second impurity regions, and channel regions, the channel regions being between the first impurity regions and the second impurity regions, the first conductive lines are electrically connected to the first impurity regions, the plurality of first gate electrodes are adjacent to the channel regions, the capacitors are connected to the second impurity regions, contacts contact the protruding parts of the first-first conductive lines, bottom surfaces of the contacts are lower than top surfaces of the overlapping parts of the first-first conductive lines, side surfaces of the first regions of the second-first conductive lines are substantially coplanar with side surfaces of the interlayer insulating films, and the top surfaces of the overlapping parts of the first-first conductive lines contact the interlayer insulating films.

14. The semiconductor memory device as claimed in claim 13, wherein an insulating material is between the second-first conductive lines and the protruding parts of the first-first conductive lines.

15. The semiconductor memory device as claimed in claim 13, wherein a height of a top surface of the protruding parts of the first-first conductive lines from a top surface of the substrate is smaller than a height of a bottom surface of the second-first conductive lines from the top surface of the substrate.

* * * * *